US008489957B2

United States Patent
Wesel et al.

(10) Patent No.: US 8,489,957 B2
(45) Date of Patent: Jul. 16, 2013

(54) LOWER-COMPLEXITY LAYERED BELIEF PROPAGATION DECODING LDPC CODES

(75) Inventors: Richard Wesel, Manhattan Beach, CA (US); Mau-Chung Frank Chang, Los Angeles, CA (US); Yuan-Mao Chang, Santa Monica, CA (US); Andres I. Vila Casado, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 287 days.

(21) Appl. No.: 12/900,741

(22) Filed: Oct. 8, 2010

(65) Prior Publication Data
US 2011/0179333 A1     Jul. 21, 2011

Related U.S. Application Data

(63) Continuation-in-part of application No. PCT/US2009/044899, filed on May 21, 2009.

(60) Provisional application No. 61/055,104, filed on May 21, 2008.

(51) Int. Cl.
*H03M 13/00*     (2006.01)

(52) U.S. Cl.
USPC ............................ 714/752; 714/758; 714/801

(58) Field of Classification Search
USPC .......................................... 714/752, 758, 801
See application file for complete search history.

(56) References Cited

U.S. PATENT DOCUMENTS

| | | | |
|---|---|---|---|
| 8,112,695 B2 * | 2/2012 | Costa et al. | 714/781 |
| 8,196,005 B2 * | 6/2012 | Kienle et al. | 714/755 |
| 2006/0206779 A1 * | 9/2006 | Wehn et al. | 714/758 |
| 2008/0126908 A1 * | 5/2008 | Lin | 714/758 |
| 2009/0070659 A1 * | 3/2009 | Zhong et al. | 714/801 |

FOREIGN PATENT DOCUMENTS

| | | | |
|---|---|---|---|
| KR | 10-2005-0004118 A | 1/2005 |
| KR | 10-2006-0057253 A | 5/2006 |
| KR | 10-2008-0000479 A | 1/2008 |

OTHER PUBLICATIONS

Yeo, R. et al.—"High Throughput Low-Density Parity-Check Decoder Architectures"—Proc. 2001 Global Conference on Communications, pp. 3019-3024, San Antonio, TX, 2001.

Mansour, M.M. et al.—"High-Throughput LDPC Decoders"—IEEE Trans. on Very Large Scale Integration Systems, vol. 11, No. 6, Dec. 2003.

(Continued)

*Primary Examiner* — Sam Rizk
(74) *Attorney, Agent, or Firm* — John P. O'Banion

(57) ABSTRACT

Low density parity check (LDPC) decoders are described utilizing a sequential schedule called Zigzag LBP (Z-LBP), for a layered belief propagation (LBP) architecture. Z-LBP has a lower computational complexity per iteration than variable-node-centric LBP (V-LBP), while being simpler than flooding and check-node-centric LBP (C-LBP). For QC-LDPC codes where the sub-matrices can have at most one "1" per column and one "1" per row, Z-LBP can perform partially-parallel decoding with the same performance as C-LBP. The decoder comprises a control circuit and memory coupled to a parity check matrix. Message passage is performed within Z-LBP in a first direction on odd iterations, and in a second direction on even iterations. As a result, a smaller parity check matrix can be utilized, while convergence can be more readily attained. The inventive method and apparatus can also be implemented for partially-parallel architectures.

30 Claims, 13 Drawing Sheets

OTHER PUBLICATIONS

Kfir, H. et al.—"Parallel versus sequential updating for Belief Propagation decoding"—Physica A, vol. 330, pp. 259-270, 2003.

Zhang, J. et al.—"Shuffled Belief Propagation Decoding"—IEEE Trans. on Commun., vol. 53, pp. 1-31, Feb. 2005.

Radosavljevic, P. et al.—"Optimized message Passing Schedules for LDPC Decoding"—Proc. 39th Asilomar Conf. on Signals, Systems and Computers, pp. 591-595, 2005.

Vila Casado, A.I. et al.—"Informed Dynamic Scheduling for Belief-Propagation Decoding of LDPC Codes"—IEEE ICC 2007, pp. 932-937, Glasgow, Scotland, Jul. 2007.

Robertson, P. et al.—"A Comparison of Optimal and Sub-Optimal MAP Decoding Algorithms Operating in the Log Domain"—Proc. IEEE Int. Conf. on Coummun., pp. 1009-1013, 1995.

Hu, X. et al.—"Efficient Implementations of the Sum-Product Algorithm for Decoding LDPC Codes"—Proc. IEEE Global Conf. on Commun., pp. 1036-1036E, San Antonio, TX, Nov. 2001.

Sharon, E. et al.—"An Efficient Message-Passing Schedule for LDPC Decoding"—Proc. 23rd IEEE Convention of Electrical and Electronics Engineers in Israel, pp. 223-226, Sep. 2004.

Bahl, L.R. et al.—"Optimal Decoding of Linear Codes for Minimizing Symbol Error Rate"—IEEE Trans. Info. Theory, IT-20, pp. 284-287, Mar. 1974.

Chen, L. et al.—"Near-Shannon-Limit Quasi-Cyclic Low-Density Parity-Check Codes"—IEEE Trans. on Commun., vol. 52, No. 7, pp. 1038-1042, Jul. 2004.

Hovecar, D.—"A Reduced Complexity Decoder Architecture via Layered Decoding of LDPC Codes"—Proc. Signal Processing Systems SIPS 2004, pp. 107-112, Oct. 2004.

Jones, C. et al.—"Functions and Architectures for LDPC Decoding"—IEEE ITW 2007, p. 577-583, Lake Tahoe, California, Sep. 2007.

Li, Z. et al.—"Efficient Encoding of Quasi-Cyclic Low-Density Parity-Check Codes"—IEEE Trans. on Commun., vol. 54, No. 1, pp. 71-81, Jan. 2006.

Mansour, M.M. et al.—"Turbo Decoder Architectures for Low-Density Parity-Check Codes"—Proc. IEEE Global Conf. on Commun., pp. 1383-1388, Taipei, Taiwan, Nov. 2002.

Chang, Y. et al.—"Lower-Complexity Layered Belief-Propagation Decoding of LDPC Codes"—IEEE Int. Conf. on Coummun., pp. 1155-1160, Beijing, China, May 19-23, 2008.

International Search Report and Written Opinion from corresponding PCT International Patent Application No. PCT/US09/044899, report issued Jan. 15, 2010, pp. 1-12.

European Telecommunications Standards Institute (ETSI). Digital Video Broadcasting (DVB) Second generation, framing structure for broadband satellite applications; EN 302 307 V1.1.1. 2005, pp. 1-74.

IEEE 802.16e: Air Interface for Fixed and Mobile Broadband Wireless Access Systems, IEEE, 2004, pp. 1-857.

IEEE P802.11n/D1.05 Oct. 2006, Wireless LAN Medium Access Control (MAC) and Physical Layer (PHY) specifications—Enhancements for Higher Throughput (Draft), pp. 1-42.

IEEE P802.15.3c/Jul. 2007, Wireless Personal Area Network (WPAN) Standard Physical Layer (PHY) specifications (Draft), pp. 1-141.

* cited by examiner

LOWER-COMPLEXITY LAYERED BELIEF PROPAGATION DECODING LDPC CODES

CROSS-REFERENCE TO RELATED APPLICATIONS

This application a 35 U.S.C. §111(a) continuation-in-part of PCT international application number PCT/US2009/044899 filed on May 21, 2009, incorporated herein by reference in its entirety, which is a nonprovisional of U.S. provisional patent application Ser. No. 61/055,104 filed on May 21, 2008, incorporated herein by reference in its entirety. Priority is claimed to each of the foregoing applications.

The above-referenced PCT international application was published as PCT International Publication No. WO 2009/143375 on Nov. 26, 2009 and republished on Mar. 18, 2010, and is incorporated herein by reference in its entirety.

STATEMENT REGARDING FEDERALLY SPONSORED RESEARCH OR DEVELOPMENT

This invention was made with Government support of Grant No. N66001-06-1-2034 awarded by the Navy. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to decoding low density parity check (LDPC) codes, and more particularly to controlling message passing within the decoder in response to odd and even iterations of the decoding process.

2. Description of Related Art

Low-Density Parity-Check (LDPC) codes comprise linear block codes defined by a very sparse parity-check matrix H, and are often proposed as the channel coding solutions for modern wireless communication systems, magnetic storage systems and solid-state drive systems. Medium-rate LDPC codes are used in standards, such as DVB-S2, WiMax (IEEE 802.16e), and wireless LAN (IEEE 802.11n). Furthermore, high-rate LDPC codes have been selected as the channel coding scheme for mmWave WPAN (IEEE 802.15.3c). These recent successes of LDPC codes appear primarily in response to their structures which are readily implemented in partially-parallel decoders. These structured codes, called quasi-cyclic LDPC (QC-LDPC), have been adopted in all the standards mentioned above.

QC-LDPC codes are represented as an array of sub-matrices, such as by the following.

$$H_{QC} = \begin{bmatrix} A_{1,1} & \cdots & A_{1,t} \\ \vdots & & \vdots \\ A_{s,1} & \cdots & A_{s,t} \end{bmatrix},$$

where each sub-matrix $A_{i,j}$ is a p×p circulant matrix. A circulant matrix is a square matrix in which each row is a one-step cyclic shift of the previous row, and the first row is a one-step cyclic shift of the last row.

QC-LDPC decoders have a significantly higher throughput than the decoders of random sparse matrices. The QC-LDPC structure guarantees that at least p messages can be computed in a parallel fashion at all times if a flooding schedule is used. It should be appreciated that well-designed QC-LDPC codes perform as well as utilizing random sparse matrices.

The original message-passing schedule, called flooding, updates all the variable-nodes simultaneously using the previously generated check-to-variable messages and then updates all the check-nodes simultaneously using the previously generated variable-to-check messages. Sequential message-passing schedules are used to update the nodes sequentially instead of simultaneously. Several studies show that sequential scheduling not only improves the convergence speed in terms of number of iterations but also outperforms traditional flooding scheduling for a large number of iterations. Different types of sequential schedules exist, such as a sequence of check-node updates and a sequence of variable-node updates. Sequential scheduling can also be referred to as Layered Belief Propagation (LBP), which will be utilized herein to refer to all sequential schedules.

Check-node-centric LBP (C-LBP) is a term which indicates a sequence of check-node updates, and variable-node-centric LBP (V-LBP) indicates a sequence of variable-node updates. Simulations and theoretical results show that LBP converges about twice as fast as flooding because the messages are updated using the most recent information available as opposed to updating several messages with the same pre-update information. C-LBP has the same decoding complexity per iteration as flooding, thus providing a convergence speed increase at no cost. However, V-LBP solutions have a higher complexity per iteration than flooding and C-LBP. This higher complexity arises from the check-to-variable message computations.

Furthermore, QC-LDPC codes where the sub-matrices can have at most one "1" per column and one "1" per row facilitate C-LBP and V-LBP decoding in a partially-parallel fashion. This parity-check matrix structure allows partially-parallel processing for each of the p nodes over the bi-partite graph, and each processor uses the most recent information available. Thus, QC-LDPC structures guarantee that C-LBP and V-LBP can perform partially-parallel computations and maintain a sequential schedule.

However, small-to-medium blocklength high-rate QC-LDPC codes generally require more than one diagonal per sub-matrix, while only allowing one row of sub-matrices. In these cases, the single row of sub-matrices is necessary because multiple rows require the sub-matrix size to be too small to provide the necessary throughput. FIG. 1 is a cyclic-shift diagonal diagram showing the structure of the parity-check matrix of a regular high-rate LDPC code. Diagonal lines represent the "1"s of H. For example, the rate-14/15 LDPC code proposed in the IEEE 802.15.3c standard is a regular code with a similar parity check matrix structure to the one shown in FIG. 1. Its blocklength is 1440, and its check-node degree $d_c$ is 45. Therefore, conventional C-LBP decoders cannot be implemented in a partially-parallel fashion.

Accordingly, a need exists for a system and method of decoding LDPC codes with reduced overhead while not increasing error rate or convergence iterations. These needs and others are met within the present invention, which overcomes the deficiencies of previously developed LDPC decoding systems and methods.

BRIEF SUMMARY OF THE INVENTION

The present invention is a method, apparatus and/or system for decoding data blocks encoded with low-density parity checks (LDPC) codes. More particularly, the invention provides for the scheduling of message passing and accumulation within a parity check matrix by a control circuit. A parity check matrix, comprising for example three layers of soft exclusive-OR (Soft-XOR) gates, is configured with check-nodes and variable-nodes through which messages are passed. The control circuit sequences message passing in a zigzag pattern on the parity check matrix through a number of iterations until the result converges or an iteration limit is reached. Message passing performed within the present invention is performed differently on the even and odd iterations of the sequence, and in particular forward and backward computations are performed on different iterations, for example backward operations on odd iterations and forward operations on even iterations. The resulting method and system provides rapid convergence and can be performed with a small parity check matrix. Embodiments of the inventive method can also perform partially-parallel computations while maintaining the sequential schedule.

The invention is amenable to being embodied in a number of ways, including but not limited to the following descriptions.

One embodiment of the invention is an apparatus, comprising: (a) a parity check matrix having multiple rows of interconnected exclusive-OR gates; and (b) a control circuit configured for sequential scheduling of message passing to update check-nodes and variable-nodes when decoding codeword data blocks received by the apparatus; the control circuit adapted for performing variable-node updates in a zigzag pattern over the parity check matrix in which generation and propagation of messages is performed in opposite directions through the parity check matrix for even and odd iterations of sequential scheduling. The computations are preferably completed when the codeword converges or a predetermined number of iterations is reached during computation.

The apparatus provides pipelined checksum decoding of low density parity check (LDPC) encoded data blocks through the parity check matrix in response to updating based on layered belief propagation (LBP). It should be appreciated that the present invention can be utilized to provide channel coding within a variety of applications, including various communications systems, magnetic storage systems and solid-state drive systems.

In one embodiment the control circuit is configured for updating sub-matrix columns within the parity check matrix for performing partially-parallel checksum decoding within the apparatus.

In at least one embodiment, the interconnected exclusive-OR gates comprise a backward row, a forward row, and at least one other uni-directional row between the backward and forward rows. Either forward message accumulation or backward message accumulation is performed within each iteration of sequential scheduling, without the need of performing both forward and backward message accumulation for each iteration. In at least one implementation, the parity check matrix comprises a sparse parity check matrix having at most one "1" per column and one "1" per row.

One embodiment of the invention is an apparatus, comprising: (a) a memory configured for retaining messages and accumulating forward and backward messages for check-nodes within an associated parity check matrix having multiple rows of interconnected exclusive-OR gates; and (b) a control circuit configured for sequential scheduling of message passing to update check-nodes and variable-nodes on the associated parity check matrix when decoding codeword data blocks received by the apparatus; with a control circuit adapted for performing variable-node updates in a zigzag pattern over the associated parity check matrix in which generation and propagation of messages is performed in opposite directions through the parity check matrix for even and odd iterations of sequential scheduling. The apparatus in combination with a parity check matrix performs pipelined checksum decoding of low density parity check (LDPC) encoded data blocks through the parity check matrix in response to updating based on layered belief propagation (LBP).

In at least one embodiment, the control circuit is configured for updating sub-matrix columns within an associated parity check matrix for performing partially-parallel checksum decoding within the apparatus.

One embodiment of the invention is a method of performing pipelined checksum decoding of low density parity check (LDPC) encoded data blocks through a parity check matrix in response to updating based on layered belief propagation (LBP), comprising: (a) sequentially scheduling message passing to update check-nodes and variable-nodes within a parity check matrix through a series of iterations; (b) generating and propagating messages in a first direction on odd iterations; and (c) generating and propagating messages in a second direction on even iterations.

In at least one embodiment, sub-matrix columns are updated within an associated parity check matrix in response to performing partially-parallel checksum decoding within said apparatus.

The present invention provides a number of beneficial aspects which can be implemented either separately or in any desired combination without departing from the present teachings.

An aspect of the invention is a low-density parity check (LDPC) decoder adapted for speeding convergence while minimizing the size of the parity check matrix.

Another aspect of the invention is a control circuit for sequencing the message passing and accumulation on an associated parity check matrix of an LDPC decoder.

Another aspect of the invention is a control circuit which modulates the types of message passing performed in response to iteration number.

Another aspect of the invention is a control circuit which generates and accumulates forward and backward messages on differing odd and even iterations of the convergence process.

Another aspect of the invention is a control circuit which is configured for performing partially-parallel checksum decoding.

Another aspect of the invention is a method of performing the LDPC decoding without the need of flooding or performing both forward and backward message passing on the same iteration.

Another aspect of the invention is a LDPC decoder in which the parity check matrix comprises multiple rows of interconnected exclusive-OR gates.

Another aspect of the invention is a LDPC decoder which converges about twice as fast as flooding decoders.

Another aspect of the invention is a LDPC decoder whose required memory size is equal only to the number of edges of the bi-partite graph.

Another aspect of the invention is a LDPC decoder which requires ⅓ fewer XOR blocks than are required for either flooding or C-LBP decoders.

Another aspect of the invention is a LDPC decoder which has a computational complexity per iteration of Z-LBP which is $d_c/2$ times simpler than that of V-LBP, for a degree-$d_c$ check-node.

A still further aspect of the invention is a LDPC decoder which can be incorporated within various apparatus and systems, such as wireless communication systems, magnetic storage systems and solid-state drive systems, and so forth.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus and methods generally described with reference to FIG. 2 through FIG. 13. It will be appreciated that the apparatus may vary as to configuration and as to details of the parts, and that the method may vary as to the specific steps and sequence, without departing from the basic concepts as disclosed herein.

1. Introduction.

The present invention utilizes a zigzag LBP scheduling scheme called Z-LBP that can decode any LDPC code as well as partially-parallel decoding for QC-LDPC codes. This novel strategy reduces the computational complexity per iteration. Moreover, in utilizing Z-LBP, the advantages of sequential scheduling, such as faster convergence speed and better decoding performance, are maintained in comparison with flooding techniques.

A. Efficient Computation of Check-to-Variable Messages.

The message from check node $c_i$ to variable-node $v_j$ is generated, such as in response to using the following equation, $$m_{c_i \to v_j} = \prod_{v_b \in N(c_i) \backslash v_j} \text{sgn}(m_{v_b \to c_i}) \times \varphi\left(\sum_{v_b \in N(c_i) \backslash v_j} \varphi(|m_{v_b \to c_i}|)\right), \quad (1)$$

where $N(c_i) \backslash v_j$ denotes the neighbors of $c_i$ excluding $v_j$, and $\varphi(x)$ is defined as $$\varphi(x) = -\log\left(\tanh\left(\frac{x}{2}\right)\right).$$

Result $m_{c_i \to v_j}$ is usually generated using a binary operator called Soft-XOR denoted by ⊞, shown in the following.

$x \boxplus y = \varphi(\varphi(x) + \varphi(y))$

Soft-XOR is commutative, associative and easy to implement, allowing Eq. (1) to be practically implemented as follows, $$m_{c_i \to v_j} = \prod_{v_b \in N(c_i) \backslash v_j} \text{sgn}(m_{v_b \to c_i}) \boxplus_{v_b \in N(c_i)/v_j} m_{v_b \to c_i} \quad (2)$$

Eq. (2) shows that $d_c-2$ Soft-XORs are required to compute each message $m_{c_i \to v_j}$. Therefore, $d_c(d_c-2)$ Soft-XORs are required to separately compute all the $m_{c_i \to v_j}$ from the same check node $c_i$.

Figure 1:
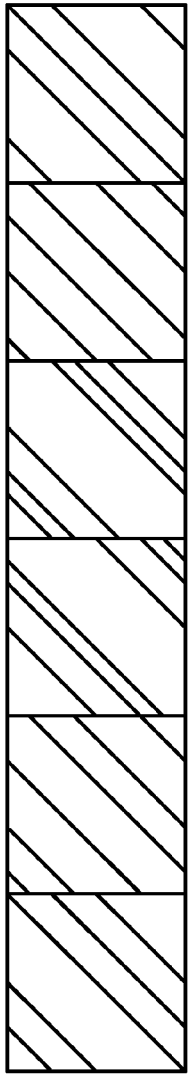
FIG. 1 is a cyclic-shift diagonal diagram showing the structure of a conventional parity check matrix of regular high-rate low-density parity-check (LDPC) codes.
Figure 2:
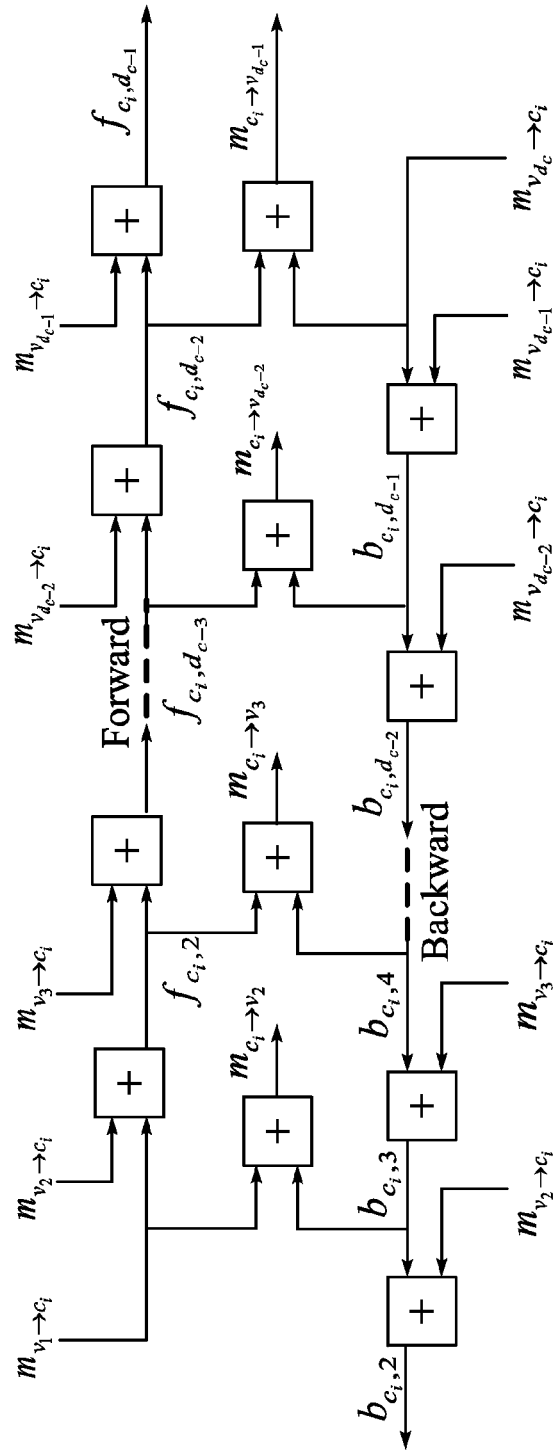
FIG. 2 is a schematic diagram of a parity check matrix having three rows of soft exclusive-OR logic blocks.

FIG. 2 illustrates an example embodiment of an efficient parity check matrix. If a message-passing schedule requires the decoder to compute all the messages $m_{c_i \to v_j}$ from the same $c_i$ simultaneously, an efficient means for performing this is shown in the parity check matrix of FIG. 2. For any degree-$d_c$ check-node, first $d_c-2$ intermediate values are generated, with $f_{c,1} = m_{v_1 \to c_i}$, and $f_{c,j} = f_{c,j-1} \boxplus m_{v_j \to c_i}$ for $j = \{2, \ldots, d_c-1\}$. This first step successively accumulates messages $m_{v_j \to c_i}$ in a forward order. Then, $d_c-2$ intermediate values are generated with $$b_{c,d_c} = m_{v_{d_c} \to c_i},$$

and $b_{c,j} = b_{c,j+1} \boxplus m_{v_j \to c_i}$ for $j = \{d_c-1, \ldots, 2\}$. This second step successively accumulates messages $m_{v_j \to c_i}$ in a backward order. Finally, $m_{c_i \to v_j}$ is computed by doing $f_{c,j-1} \boxplus b_{c,j+1}$. This method uses $3(d_c-2)$ Soft-XORs to correctly compute all the messages $m_{c_i \to v_j}$ from the same check-node $c_i$ at the same time. This algorithm is optimal in the sense that no algorithm using fewer Soft-XORs can correctly compute all messages $m_{c_i \to v_j}$ simultaneously from the same $c_i$. Flooding and C-LBP decoders use this strategy because they compute all them $m_{c_i \to v_j}$ from the same $c_i$ at the same time.

The efficient parity check matrix of FIG. 2 allows for calculating $m_{c_i \to v_j}$ from the same $c_i$. This check-node update is equivalent to the BCJR algorithm over the trellis representation of the check-node equation in the log-likelihood domain. The forward accumulation of $f_{c,j}$ corresponds to the BCJR $\alpha$ recursion in the log-likelihood domain. Also, the backward accumulation of $b_{c,j}$ corresponds to the BCJR $\beta$ recursion in the log-likelihood domain.

B. V-LBP Implementation Issues.

V-LBP solutions proposed in the industry have a higher complexity per iteration than flooding and C-LBP. The higher complexity arises from the check-to-variable message computations. Since the V-LBP algorithm sequentially updates variable-nodes, it does not allow computing all the messages $m_{c_i \to v_j}$ from the same check-node $c_i$ at the same time. Hence, the required number of Soft-XORs to compute all the messages $m_{c_i \to v_j}$ from the same check-node $c_i$ is given by $d_c(d_c-2)$.

One method for reducing the complexity of V-LBP is to define $M_{c_i}$ as, $$M_{c_i} = \prod_{v_b \in N(c_i)} \text{sgn}(m_{v_b \to c_i}) \boxplus_{v_b \in N(c_i)} m_{v_b \to c_i} \quad (3)$$

where $M_{c_i}$ is the Soft-XOR of all $m_{v_j \to c_i}$ destined to the same check-node $c_i$.

A Soft-XOR's inverse operator, Soft-XNOR, denoted by $\boxminus$, is defined as follows, $$x \boxminus y = \phi(\phi(x) - \phi(y)).$$

Thus, the message from check-node $c_i$ to variable-node $v_j$ can be computed according to, $$m_{c_i \to v_j} = M_{c_i} \boxminus m_{v_j \to c_i} \quad (4)$$

The decoder first initializes all $M_{c_i}$ for each check-node. Then, separately generates all the messages $m_{c_i \to v_j}$ using Eq. (4). Also, when a new message $m_{v_j \to c_i}$ is computed, $M_{c_i}$ is re-calculated using, $$M_{c_i} = m_{c_i \to v_j} \boxplus m_{v_j \to c_i}$$

In each iteration, computing all the messages $m_{c_i \to v_j}$ from the same check-node $c_i$ requires $d_c$ Soft-XNORs. Moreover, $d_c$ Soft-XORs are needed to re-calculate $M_{c_i}$ since there will be $d_c$ new messages $m_{v_j \to c_i}$ on every iteration. Assuming that the complexity of Soft-XOR and Soft-XNOR is the same, the number of required operations per iteration needed to update a check-node is $2d_c$. Term $d_c$ is omitted from the number of Soft-XORs required to compute $M_{c_i}$ initially in Eq. (3).

However, Soft-XNORs are not invertible on every point. Without loss of generality, assume $m_{v_1 \to c_i}$ is 0. Then, $M_{c_i}$ is 0, whereby messages $m_{c_i \to v_1} = \phi(\phi(0) - \phi(0)) = \infty$. Also, even if all messages $|m_{v_j \to c_i}|$ are non-zero, this algorithm remains numerically unstable because the dynamic range of Soft-XNOR is $[0, \infty)$. When the two arguments of Soft-XNOR are similar, the output is very large and runs out of quantization levels. It is realized in the industry that this large quantization noise makes implementation of this strategy impractical.

C. C-LBP Implementation Issues.

Algorithm 1 describes the partially-parallel version of the C-LBP algorithm. The C-LBP decoder processes one row of sub-matrices at the same time. Separate processors simultaneously update all check nodes $C_1$ in the same row of sub-matrices 1. Different variable-to-check messages $m_{V \to C_1}$ must be generated and propagated at the same time. If each sub-matrix contains at most one "1" per column and one "1" per row, the processors access disjoint sets of variable nodes. This guarantees that each processor uses the most recent information available even if all the processors perform in parallel.

| Algorithm 1: Partially-Parallel C-LBP |
| --- |
| 1: Initialize all $m_{c_i \to v_j} = 0$ |
| 2:     for every row of sub-matrix 1 do |
| 3:         Generate and propagate $m_{V \to C_1}$ |
| 4:         Generate and propagate $m_{C_1 \to V}$ |
| 5:     end for |
| 6: If Stopping rule is not satisfied then |
| 7:     go to Step 2 |
| 8: end if |

However, for small-to-medium blocklength high-rate QC-LDPC codes, the parity-check matrix contains only one row of sub-matrices, and there are more-than-one "1" per row and column of sub-matrix which prevents decoding from being sequential. Moreover, step 3 and 4 in Algorithm 1 become the variable-node update and check-node update of the flooding scheduling respectively. Therefore, partially-parallel C-LBP becomes exactly the same as flooding in complexity, convergence speed, and decoding capability. Partially-parallel C-LBP for small-to-medium high-rate QC-LDPC codes is not a sequential schedule.

2. Principles of Operation.

A novel LBP schedule is put forth in the present invention which requires fewer operations per iteration than flooding, C-LBP, or V-LBP to compute all the messages $m_{c_i \to v_j}$. Zigzag LBP is a V-LBP strategy that performs variable-node updates in a zigzag pattern over the parity-check matrix. Unidirectional (one-directional) updating, forward updating or backward updating of all variable-nodes, corresponds to one iteration. Zigzag updating guarantees that all the messages $m_{c_i \to v_j}$ can be generated as will be presented in a later section.

It will be appreciated that the message passing decoding algorithm needs to update both variable nodes and check nodes. The main difference between C-LBP and V-LBP is the update order. Check-node-centric LBP (C-LBP) indicates a sequence of check-node updates, but also updates the variable nodes. After C-LBP updates a check node, the decoder updates the neighbors of the check node. Variable-node-centric LBP (V-LBP) indicates a sequence of variable-node updates. After V-LBP updates a variable node, then similarly the decoder updates the neighbors of the variable node. Z-LBP uses different sequencing than V-LBP and C-LBP and also updates both variable nodes and check nodes.

Figure 3A:
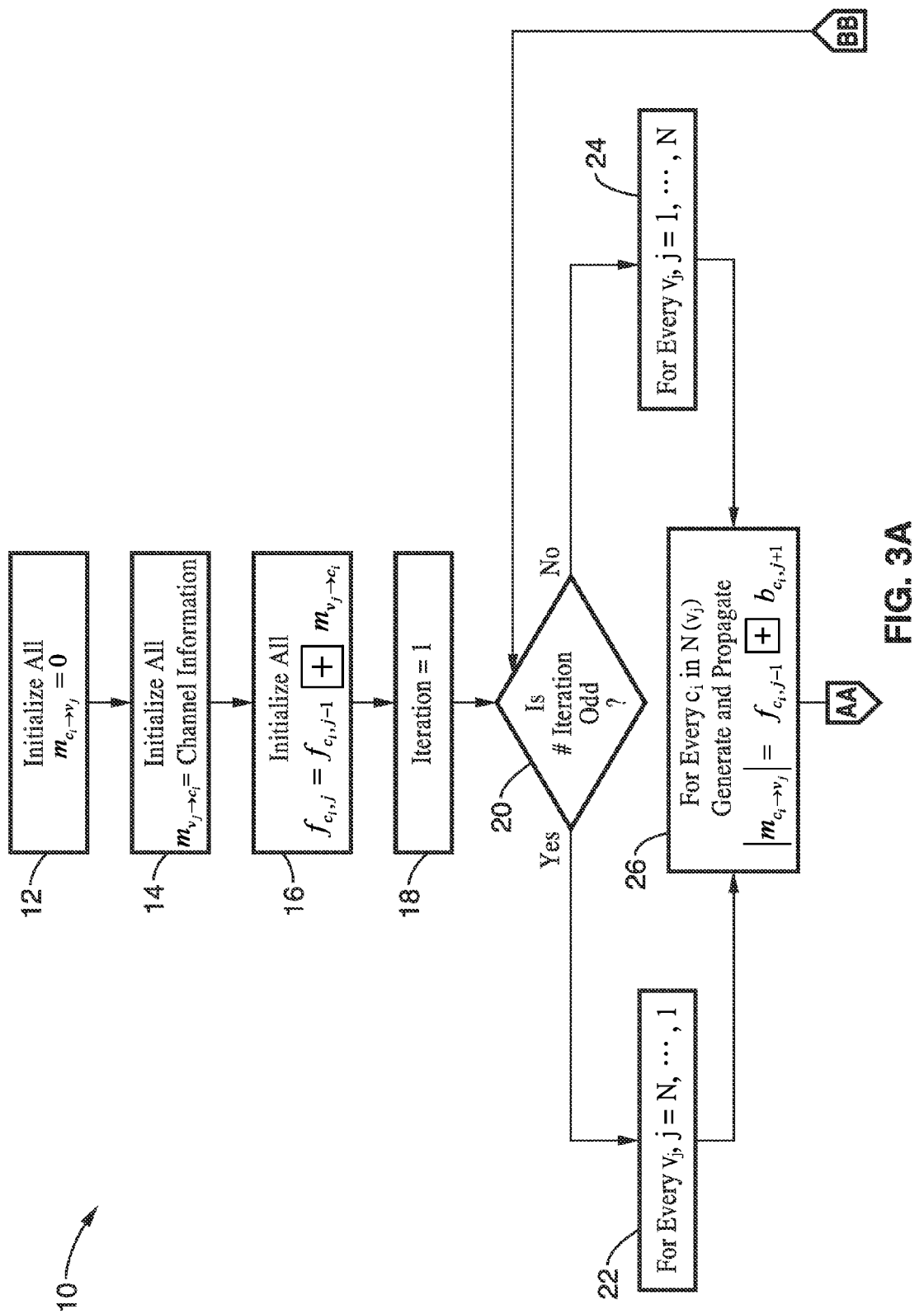
FIG. 3 is a flowchart of Z-LBP decoding according to an embodiment of the present invention, showing different processing performed for odd and even iterations during convergence.
Figure 3B:
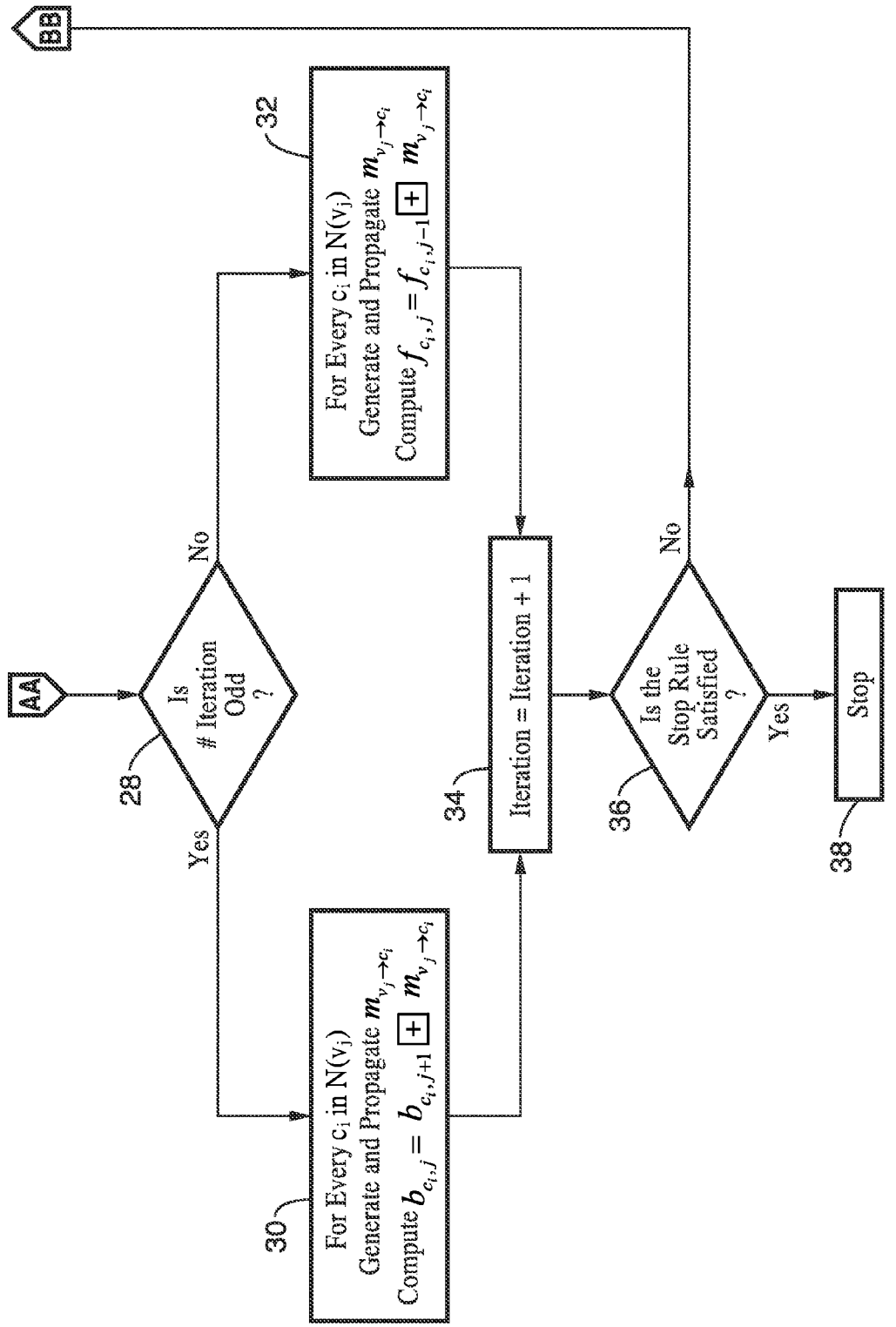

FIG. 3 (as well as Algorithm 2) formally presents an embodiment 10 of the Z-LBP algorithm. Referring to the figure, the decoder first initializes all messages 12, as well as channel information 14, and $f_{c,j}$ 16 of every check-node. Iteration count is initialized 18 prior to commencing the iteration loop. Within the iteration loop, a check for even/odd iteration count is performed 20. For the first iteration, as well as all the odd iterations, a sequential update of variable-nodes $v_j$, $j=\{N, \ldots, 1\}$ in a backward fashion 22. All the messages $m_{c_i \to v_j}$ destined to the same variable-node $v_j$ are generated 26 using $f_{c_i,j-1} \boxplus b_{c_i,j+1}$. Then, for odd iterations as checked by block 28 the decoder generates 30 all the messages $m_{v_j \to c_i}$ from the same variable-node $v_j$. The decoder then calculates all the $b_{c,j}$ for every $c_i$ that is a neighbor of variable-node $v_j$ using $b_{c_i,j+1} \boxplus m_{v_j \to c_i}$. Iteration count is advanced in block 34 and stop rules checked in 36, and if the stop rules are met then iterations are completed 38.

If the stop condition is not met, then a return to block 20 occurs, and with the second iteration, as well as all even iterations, a jump to block 24 is made to update the variable-nodes $v_j$, $j=\{1, \ldots, N\}$ in a forward direction. All the messages $m_{c_i \to v_j}$ of the same variable-node $v_j$ are still generated 26 using $f_{c_i,j-1} \boxplus b_{c_i,j+1}$, and then all the messages $m_{v_j \to c_i}$ are generated. Finally, the decoder calculates 32 all the $f_{c,j}$ for every check-node $c_i$ that is a neighbor of variable-node $v_j$ using $f_{c_i,j-1} \boxplus m_{v_j \to c_i}$. The following details the above steps as pseudocode.

---
Algorithm 2: Z-LBP
---

1: Initialize all messages $m_{c_i \to v_j} = 0$
2: Initialize all messages $m_{v_j \to c_i} = $ Channel Information
3: Initialize all $f_{c_i,j} = f_{c_i,j-1} \boxplus m_{v_j \to c_i}$
4: Iter = 1
5: If Iter is odd then
6:     for every $v_j$, $j=\{N,\ldots,1\}$ do
7:         for every $c_i \in N(v_j)$ do
8:             Generate and propagate $|m_{c_i \to v_j}| = f_{c_i,j-1} \boxplus b_{c_i,j+1}$
9:         end for
10:        for every $c_i \in N(v_j)$ do
11:            Generate and propagate $m_{v_j \to c_i}$
12:            Compute $b_{c_i,j} = b_{c_i,j+1} \boxplus m_{v_j \to c_i}$
13:        end for
14:    end for
15: else
16:    for every $v_j$, $j=\{1,\ldots,N\}$ do
17:       for every $c_i \in N(v_j)$ do
18:           Generate and propagate $|m_{c_i \to v_j}| = f_{c_i,j-1} \boxplus b_{c_i,j+1}$
19:       end for
20:       for every $c_i \in N(v_j)$ do
21:           Generate and propagate $m_{v_j \to c_i}$
22:           Compute $f_{c_i,j} = f_{c_i,j-1} \boxplus m_{v_j \to c_i}$
23:       end for
24:    end for
25: end if
26: Iter = Iter + 1
27: If Stopping rule is not satisfied then
28:    Go to Step 5
29: end if It should be appreciated that the decoder initializes all the $f_{c,j}$ in Line 3 of Algorithm 2 following the order of the received channel information. Hence, the decoder simultaneously receives all the channel information and initializes all the $f_{c,j}$. The Z-LBP algorithm computes all the messages $m_{c_i \to v_j}$ using the forward and backward technique in a distributed fashion. However, the decoder computes messages $m_{c_i \to v_j}$ and either $f_{c,j}$ or $b_{c,j}$ for a given iteration, instead of both of them in each iteration. Thus, fewer Soft-XORs are required to update a check-node. Z-LBP requires $2(d_c-2)$ Soft-XORs in order to update a check-node. Flooding and C-LBP require $3(d_c-2)$ Soft-XORs to update a check-node, and V-LBP requires $d_c(d_c-2)$ Soft-XORs. Thus, if it is assumed that the complexity of computing check-to-variable messages is much higher than the complexity of computing variable-to-check messages, then Z-LBP is 1.5 times simpler than flooding and C-LBP and $d_c/2$ times simpler than V-LBP per iteration.

If the number of the edges of the bi-partite graph is denoted as $N_E$, whereby there are $N_E$ of the $f_{c,j}$ values and $N_E$ of the $b_{c,j}$ values. One might think that this suggests that the Z-LBP decoder calls for a memory of size $2N_E$. However, the memory required is only $N_E$, because $b_{c,j}$ can be written in the same memory address of $f_{c,j}$ given that $f_{c,j}$ is not needed anymore. The same is also true for the even iterations, whereby the new $f_{c,j}$ can be written in the same memory address of $b_{c,j}$. Therefore, the required memory size is only $N_E$, which is the same size memory required for a C-LBP decoder and half the memory required for a flooding decoder.

Figure 4:
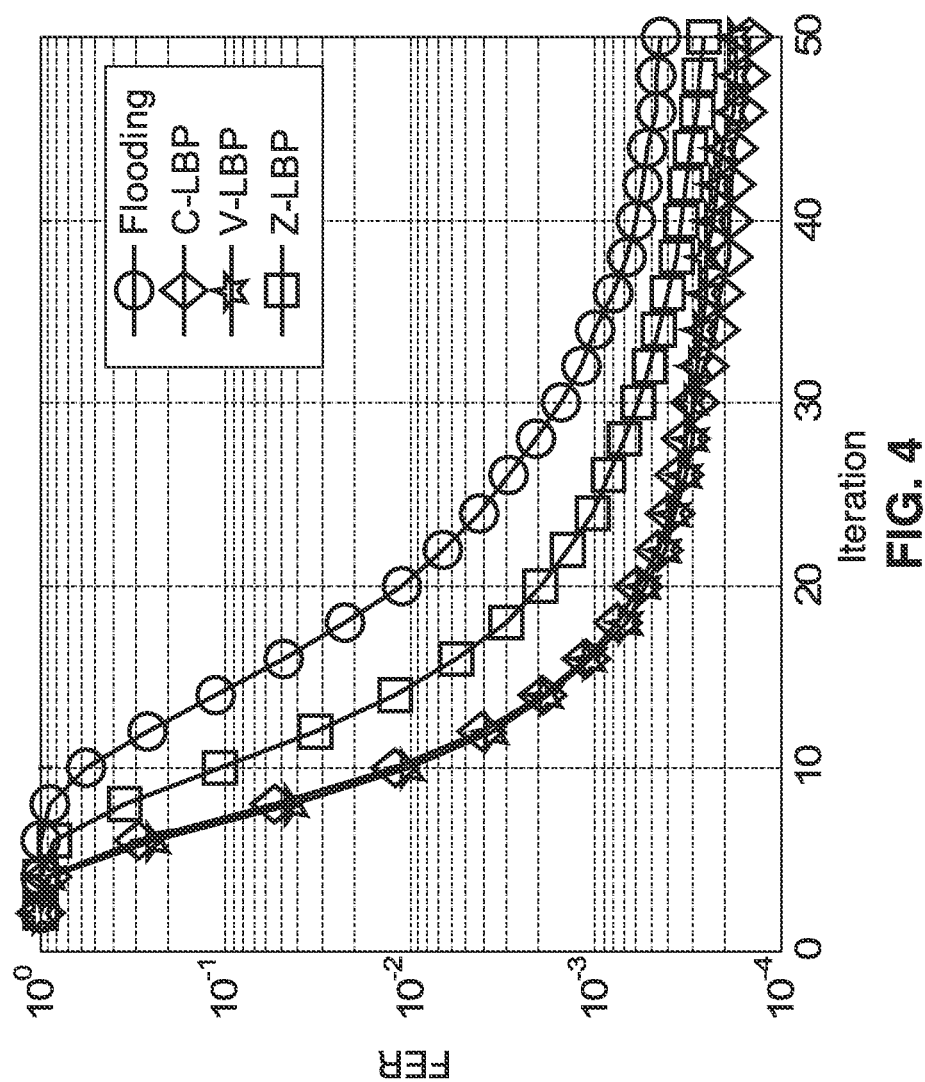
FIG. 4 is a plot comparing the number of iterations required in response to flooding, C-LBP, V-LBP and Z-LBP.

FIG. 4 depicts AWGN performance comparing four different scheduling strategies, flooding, V-LBP, C-LBP, and Z-LBP in response to an increasing number of iterations for a fixed error rate $E_b/N_0=1.75$ dB. All the simulations correspond to the blocklength-1944 rate-1/2 LDPC code presented in the IEEE 802.11n standard. This figure shows that Z-LBP has improved convergence speed over flooding techniques across all iterations. The frame error rate in response to flooding of around 20 and 40 iterations are equal to the frame error rate of Z-LBP around 15 and 30 iterations respectively. However, since the computational complexity of Z-LBP is 1.5 times simpler than that of flooding, while the convergence speed of Z-LBP for a given number of Soft-XORs is twice as fast as that of flooding.

Figure 5:
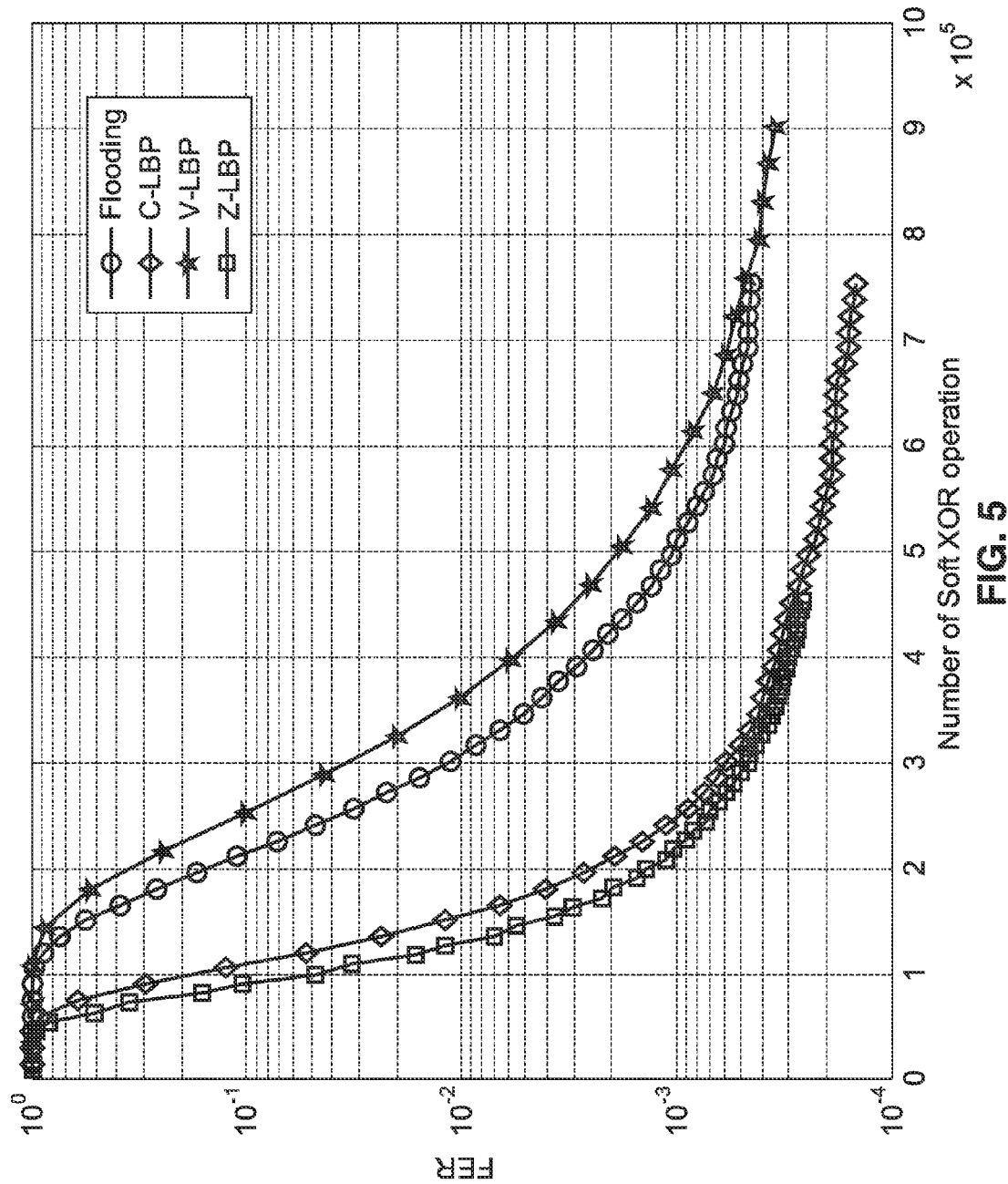
FIG. 5 is a plot comparing the number of Soft-XOR operations required in response to flooding, C-LBP, V-LBP and Z-LBP.

FIG. 5 depicts improved convergence speed for Z-LBP in relation to the number of Soft-XORs required in relation to C-LBP, for a fixed $E_b/N_0=1.75$ dB.

For a degree-$d_c$ check-node, the computational complexity of Z-LBP is $d_c/2$ times simpler than that of V-LBP. The code in the IEEE 802.11n standard has the check-node of degrees 7 and 8. Thus, the computational complexity of Z-LBP is 3.5 times simpler than that of V-LBP. Hence, the convergence speed of Z-LBP in terms of the number of Soft-XORs is around 2 times faster than V-LBP.

Figure 6:
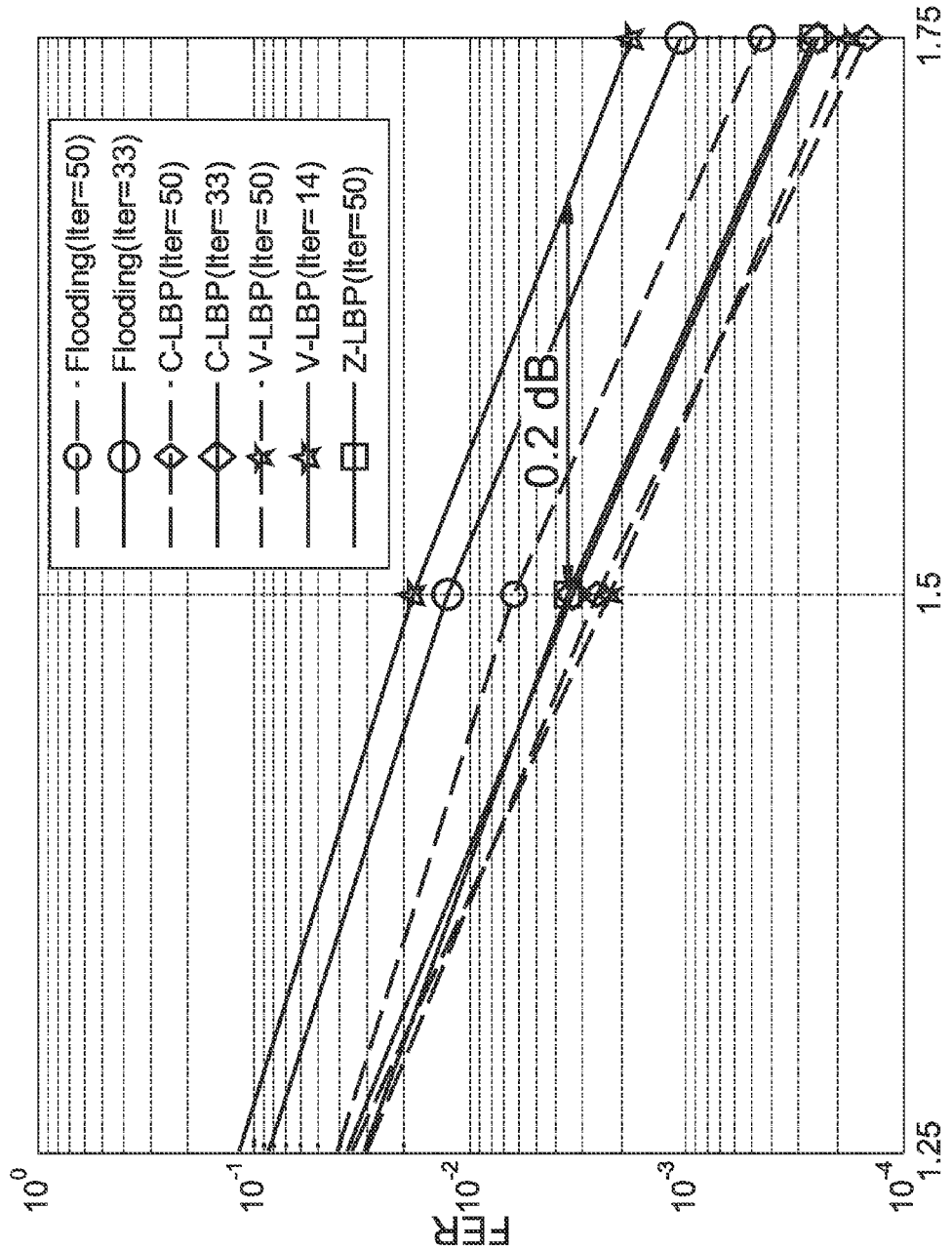
FIG. 6 is a plot comparing error differences in response to flooding, C-LBP, V-LBP and Z-LBP for different numbers of iterations.

FIG. 6 depicts frame error rates of these four scheduling strategies presented above at different signal to noise ratios (SNRs) (e.g., $E_b/N_0$). Since the complexity of Z-LBP is 1.5 times simpler than flooding and C-LBP, the 50-iteration computational complexity of Z-LBP is equivalent to the 33-iteration that of flooding and C-LBP. Similarly, Z-LBP is 3.5 times simpler than V-LBP. Thus, the execution of a 50-iteration Z-LBP takes the same computation as a 14-iteration V-LBP. The performance of Z-LBP is 0.15 dB better than flooding. There is little difference shown in the results between the performance of C-LBP and Z-LBP in regards to number of iterations. However, the coding gain between Z-LBP and V-LBP is around 0.2 dB.

Figure 7:
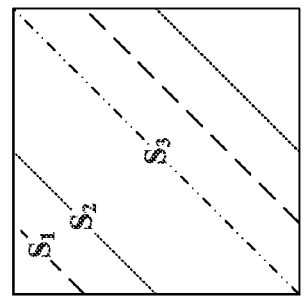
FIG. 7 is a cyclic-shift diagonal diagram in one sub-matrix of the parity check matrix according to one aspect of the present invention.

FIG. 7 illustrates cyclic-shift diagonals in one sub-matrix. Z-LBP can perform in a partially-parallel fashion by updating a column of sub-matrices. First, the cyclic-shift diagonals are labeled in each sub-matrix as shown in the figure. It is assumed that there are $N_{mat}$ sub-matrices, and each sub-matrix has $N_{diag}$ cyclic-shift diagonals ($N_{diag} > 1$).

The following outlines the changes required in Algorithm 2. The order of variable-node updates at step 6 in Algorithm 2 is slightly changed to "for every column of sub-matrix $SM_j$, $j=\{N_{mat}, \ldots, 1\}$." This labeling prevents memory access conflicts when all processors process p variable-nodes at the same time. All the $m_{c_i \to v_j}$ are still computed using $f_{c_i,j-1} \boxplus b_{c_i,j+1}$. However, since $N_{diag} > 1$, the decoder requires extra $d_c - N_{mat}$ Soft-XORs in order to compute $f_{c,j}$ or $b_{c,j}$ in advance. For example, when the decoder prepares to update the sub-matrix $SM_2$ in a forward fashion, the decoder needs to compute $f_{c,N_{diag}+j}$, $j=\{1, \ldots, N_{diag}-1\}$ in advance. Because of the computation $f_{c,j}$ or $b_{c,j}$ in advance, the decoder does not use the recent information available at step 8 and 18 in Algorithm 2. However, this does not diminish the performance significantly.

Figure 8A:
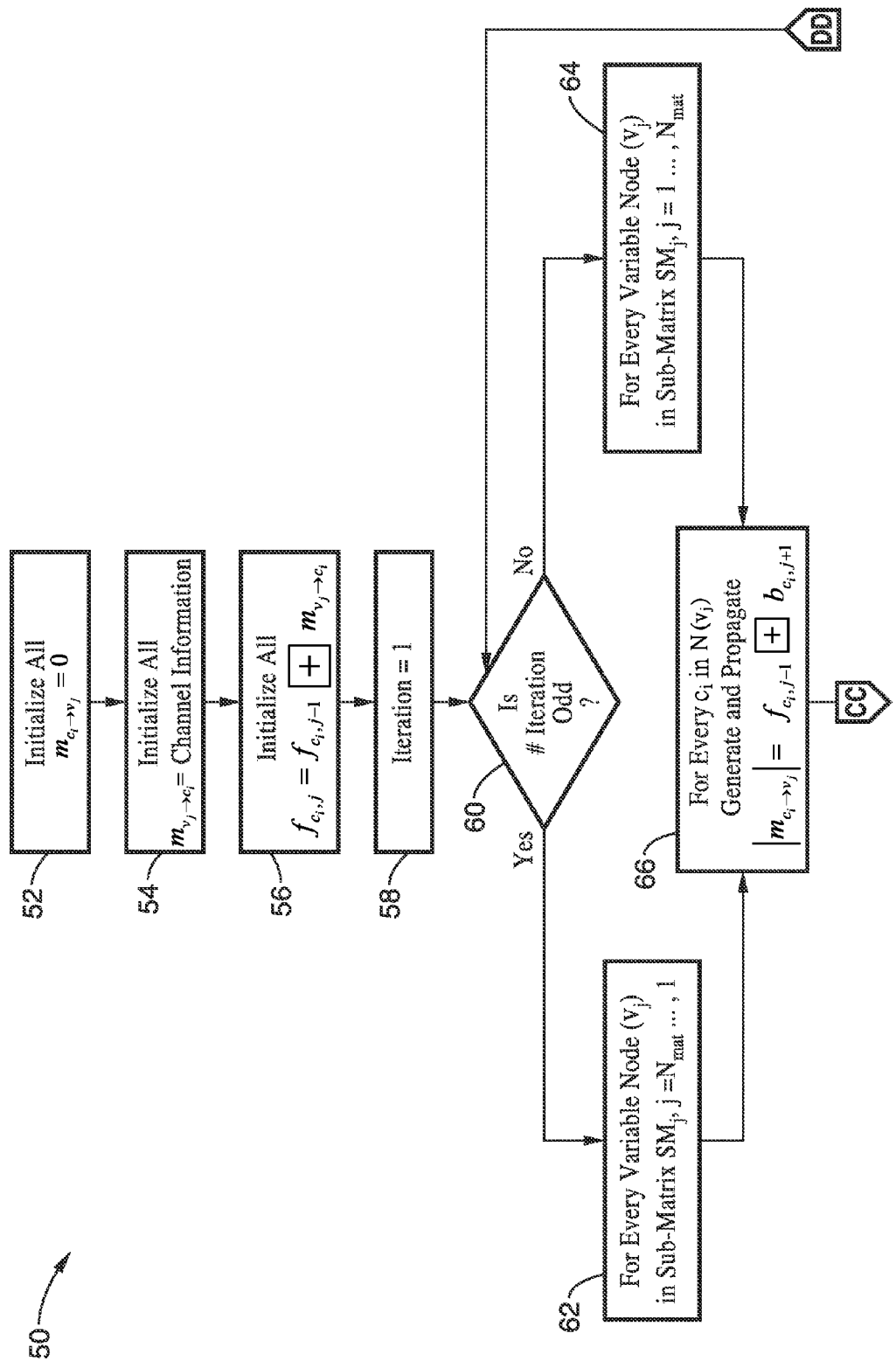
FIG. 8 is a flowchart of partially-parallel Z-LBP decoding according to an embodiment of the present invention, showing different processing performed for odd and even iterations during convergence.
Figure 8B:
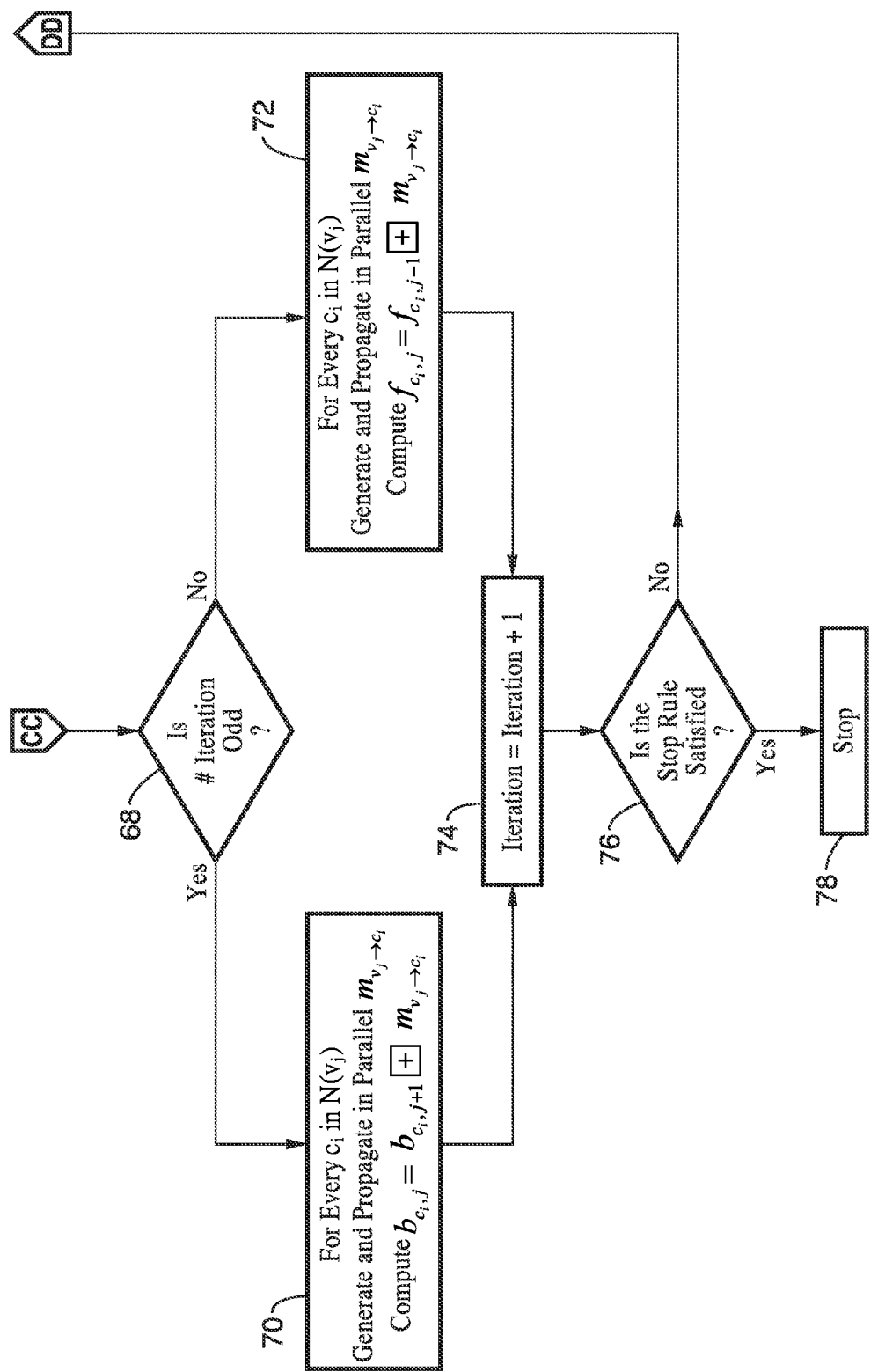

FIG. 8 illustrates the above modification of FIG. 3, showing a partially-parallel embodiment 50 of the Z-LBP algorithm. Referring to the figure, the decoder first initializes all messages, channel information and $f_{c,j}$ of check-nodes as per blocks 52, 54 and 56. Iteration count initialized 58 and iteration loop commenced 60 with a check for even/odd iteration. For the first iteration, as well as all the odd iterations, a sequential update of variable-nodes in the sub-matrix $SM_j$, $j=\{N_{mat}, \ldots, 1\}$ in a backward fashion 62. All the messages $m_{c_i \to v_j}$ destined to the same sub-matrix node $SM_j$ are generated 66 using $f_{c_i,j-1} \boxplus b_{c_i,j+1}$. Then, for odd iterations as checked by block 68 the decoder generates 70 in parallel all the messages $m_{v_j \to c_i}$ from the same variable-node. The decoder then calculates all the $b_{c,j}$ for every $c_i$ that is a node neighbor using $b_{c_i,j+1} \boxplus m_{v_j \to c_i}$. Iteration count is advanced in block 74 and stop rules checked in 76, and if the stop rules are met then iterations are completed 78. If the stop condition is not met, then a return to block 60 occurs, and with the second iteration, as well as all even iterations, a jump to block 64 is made to update the variable-nodes $SM_j$, $j=\{1, \ldots, N_{mat}\}$ in a forward direction. All the messages $m_{c_i \to v_j}$ of the same variable-node $v_j$ are still generated 66 using $f_{c_i,j-1} \boxplus b_{c_i,j+1}$, and then all the messages $m_{v_j \to c_i}$ are generated. Finally, the decoder calculates 72 all the $f_{c,j}$ for every check-node $c_i$ that is a node neighbor using $f_{c_i,j-1} \boxplus m_{v_j \to c_i}$.

Consider the rate-14/15 QC-LDPC code used in IEEE 802.15.3c. The check-node degree $d_c$ is equal to 45, and there are 15 sub-matrices. Hence, Z-LBP in a partially-parallel fashion requires 114 Soft-XORs to compute all the messages $m_{c_i \to v_j}$ from the same check-node $c_i$. V-LBP requires 1935 Soft-XORs to compute all the messages $m_{c_i \to v_j}$ from the same check-node $c_i$. The flooding schedule requires 129 Soft-XORs to compute all the messages $m_{c_i \to v_j}$ from the same check-node $c_i$. Therefore, Z-LBP is 17 times and 1.13 times simpler than V-LBP and flooding respectively.

Figure 9:
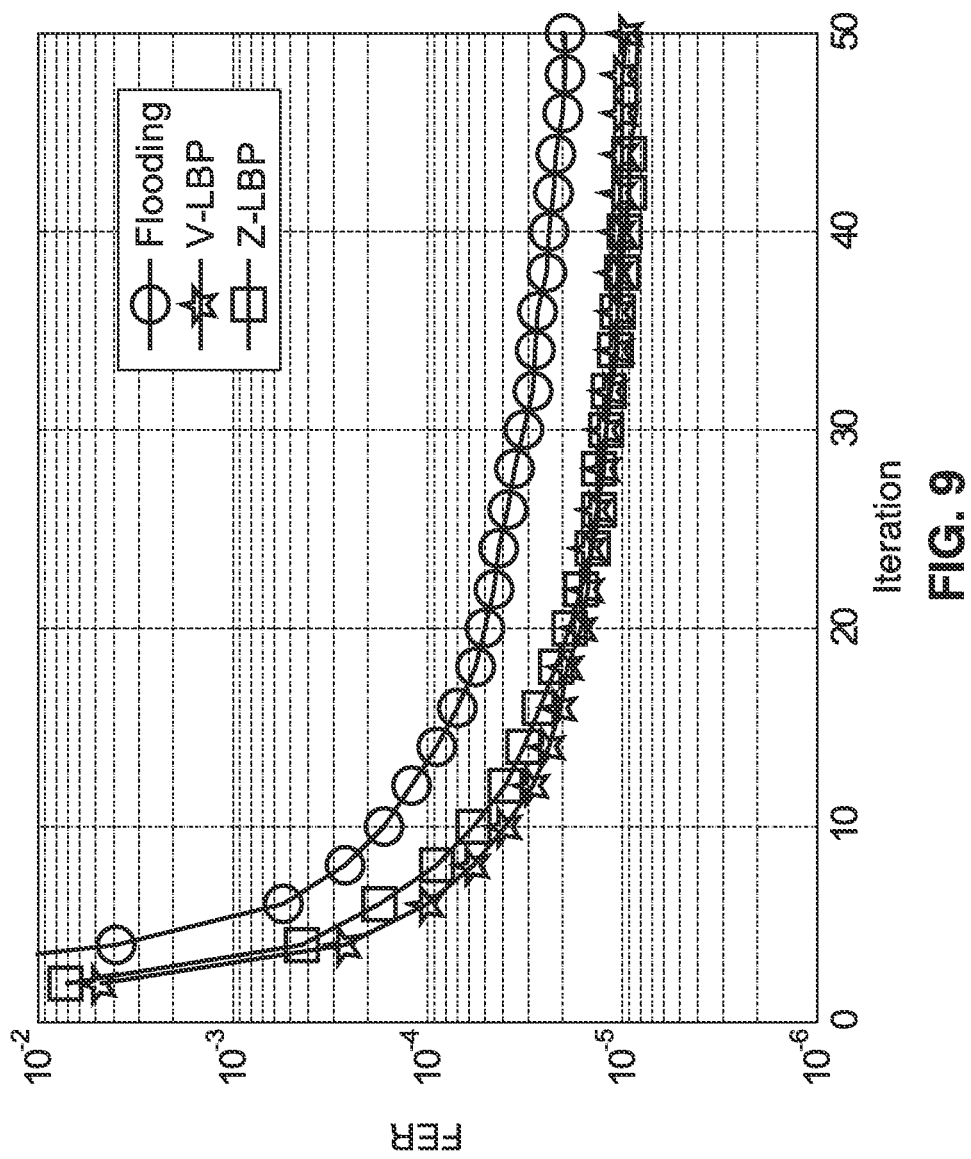
FIG. 9 is a plot of relative performance in response to flooding, C-LBP, V-LBP and Z-LBP sequence methods.

FIG. 9 depicts AWGN performance of three different scheduling strategies, flooding, V-LBP, and Z-LBP in a partially-parallel fashion, as the number of iterations increases. All the simulations use the same blocklength-1440 rate-14/15 LDPC code. Performance is compared in a partially-parallel fashion at different iterations for a fixed $E_b/N_0 = 6.0$ dB. The figure shows that Z-LBP in a partially-parallel fashion has better convergence speed than flooding across all iterations.

Figure 10:
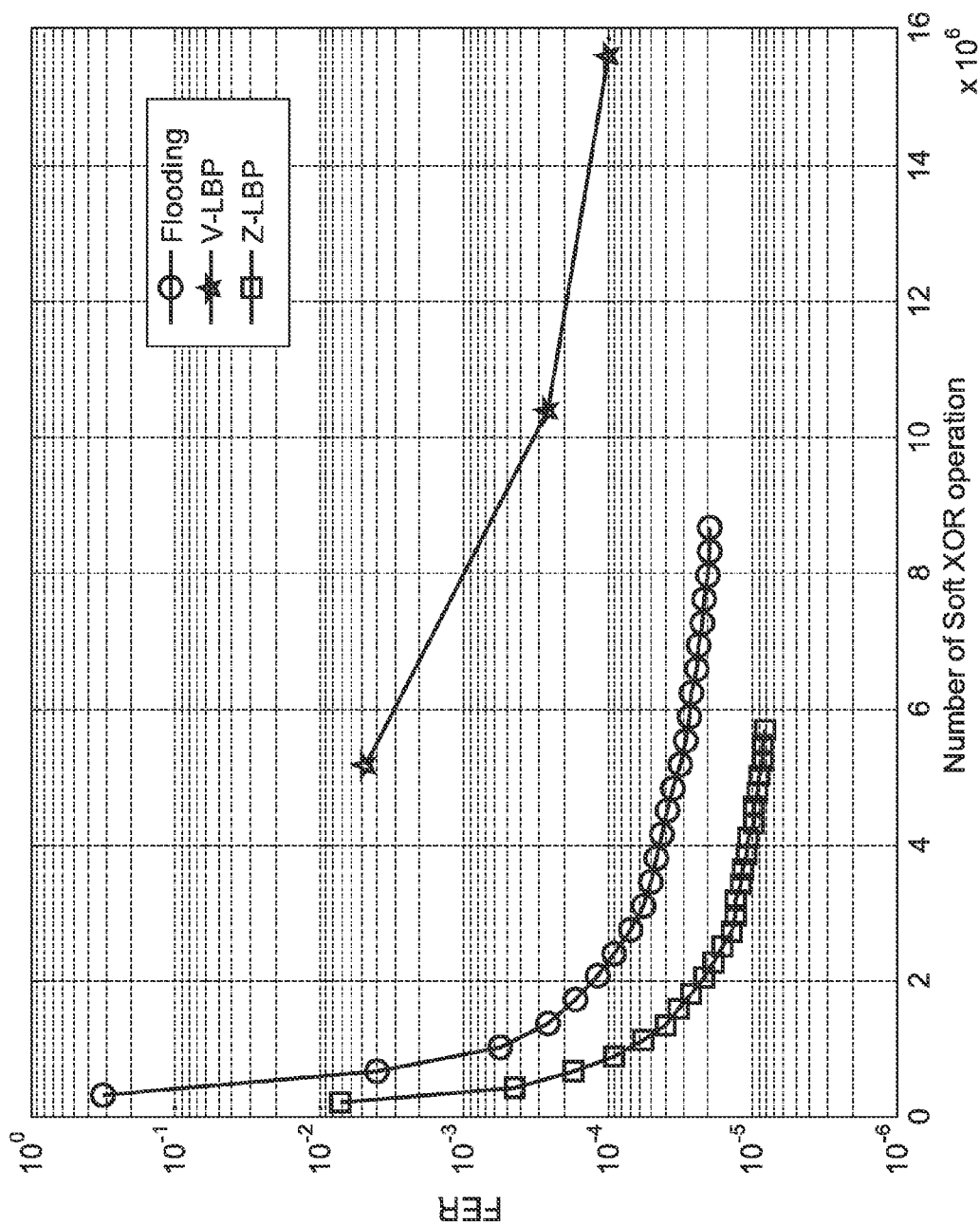
FIG. 10 is a plot of convergence speed in relation to the number of exclusive-OR elements comparing flooding, C-LBP, V-LBP and Z-LBP.

FIG. 10 illustrates convergence speed in response to number of Soft-XORs utilized, for a fixed $E_b/N_0 = 6.0$ dB. The convergence speed of Z-LBP for a given number of Soft-XORs utilized is around 3 times faster than flooding. Moreover, the convergence speed in terms of iterations of Z-LBP and V-LBP are similar. However, Z-LBP is 17 times simpler than V-LBP, and accordingly its convergence speed for a given number of Soft-XORs of Z-LBP is much faster than that of V-LBP.

Figure 11:
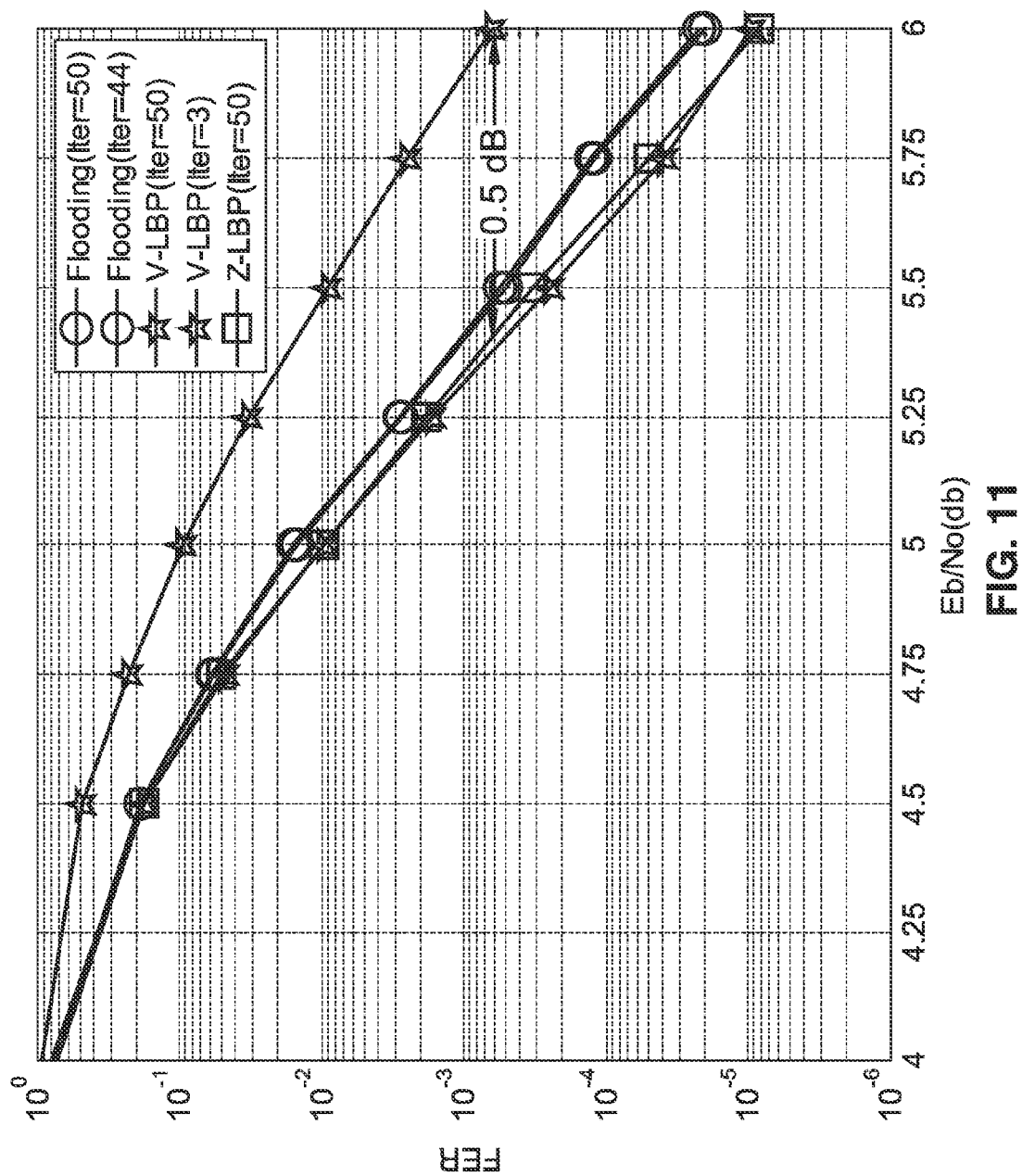
FIG. 11 is a plot comparing frame error rates for flooding, C-LBP, V-LBP and Z-LBP scheduling methods.

FIG. 11 depicts frame error rates of these three scheduling strategies (flooding, V-LBP, and Z-LBP) presented above in a partially-parallel fashion at different SNRs ($E_b/N_0$).

Since the complexity of Z-LBP is 17 times and 1.13 times simpler than V-LBP and flooding respectively, the figure compares the 50-iteration complexity of Z-LBP, 3-iteration V-LBP and 44-iteration flooding, and shows the performance gap between flooding and Z-LBP is 0.125 dB. The performance of Z-LBP is 0.5 dB better than that of V-LBP.

Figure 12:
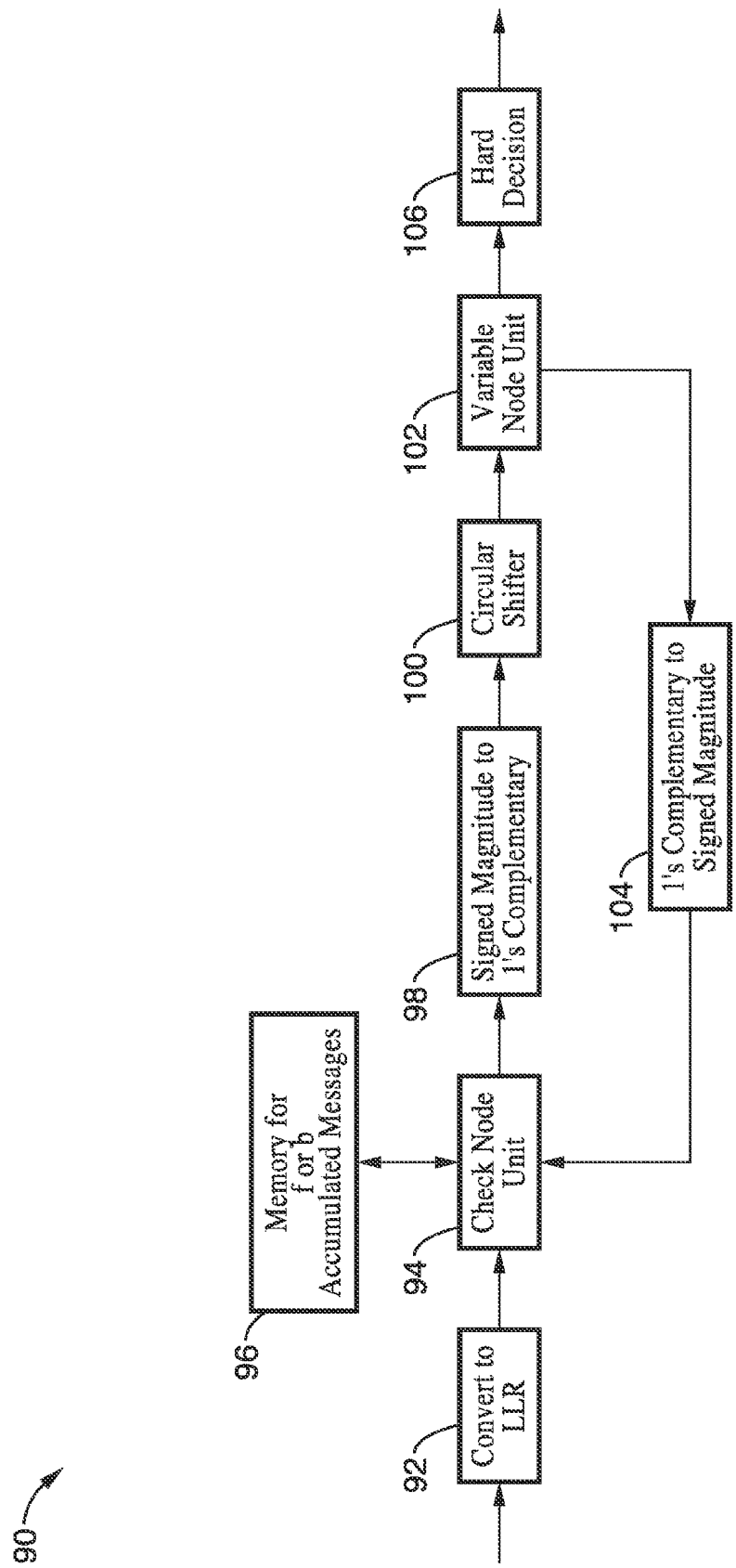
FIG. 12 is a block diagram of Z-LBP control hardware according to an embodiment of the present invention.

FIG. 12 illustrates a system hardware architecture for an example Z-LBP embodiment 90. Upon receiving channel information the first component 92 converts received signal into Log-likelihood Ratio (LLR). The embodiment assumes $y_j$ is a received signal through Gaussian channel, whereby the converting equation becomes, $$C_{v_j} = \log\left(\frac{p(y_j \mid v_j = 0)}{p(y_j \mid v_j = 1)}\right) = -\frac{2y_j}{\sigma^2}.$$

After converting channel information to LLR, the decoder can start computing $f_{c,j}$ for initialization in the check-node unit. The check-node unit is composed of Soft-XOR operator, which is described below in relation to the example implementation of FIG. 13.

The check-node unit 94 takes accumulated messages $f_{c,j}$ or $b_{c,j}$ from the memory 96 to execute the Soft-XOR operation. Then, the decoder replaces out-of-date $f_{c,j}$ or $b_{c,j}$ memory values with the latest $f_{c,j}$ or $b_{c,j}$ values. The memory size of forward or backward accumulated messages corresponds to the number of edges, $N_E$, in the bi-partite graph as described in a prior section. The efficient computation of $f_{c,j}$ or $b_{c,j}$ has been shown in FIG. 2 and described. Once the check-node unit computes all the check-node to variable-node messages $m_{c_i \to v_j}$ for the same variable-node $v_j$, the decoder changes the data format 98 from signed magnitude to 1's complement notation or 2's complementary. For 1's complementary converting, if the input number is positive, there are no additional actions to be performed. If the input number is negative, then the sign bit is kept and all the other bits are inverted. For 2's complementary converting, if the input is a positive number then there are also no additional actions to be performed. However, if the input number is negative, then the circuit retains the sign bit, inverts all the other bits and adds one. For QC-LDPC codes, the circular shifter 100 can be implemented by a barrier shifter which contains parallel multiplexers to shift the input data in order to arrange all the messages $m_{c_i \to v_j}$ for a variable-node unit 102. The message from variable-node to check-node is given by, $$m_{v_j \to c_i} = \sum_{c_a \in N(v_j) \setminus c_i} m_{c_a \to v_j} + C_{v_j}.$$

Hence, the variable-node unit 102 is composed of adders. For high speed design, the variable-node update equation can use parallel adders. However, it will occupy more area. For low complexity design, the decoder can sum up all $m_{c_a \to v_j}$ which is the posteriori LLR of the variable-node $v_j$, and then subtract $m_{c_i \to v_j}$ respectively for each message $m_{v_j \to c_i}$. The hard decision circuit 66 simply takes the MSB of posteriori LLR of each variable-node to determine the final output. The hard decision equation is $$v_j = \begin{cases} 0, & \text{if } m_{v_j} \geq 0 \\ 1, & \text{if } m_{v_j} < 0. \end{cases}$$

At this stage, the decoder 90 has finished one iteration and is ready to check the stop rule. If all the variable-nodes are satisfied with the parity check equations, the decoder can send out the hard decision outputs as final outputs. Otherwise, the decoder iteratively passes 104 messages from variable-node units to check-node units until the codeword converges or the decoder reaches the maximum iterations.

Figure 13:
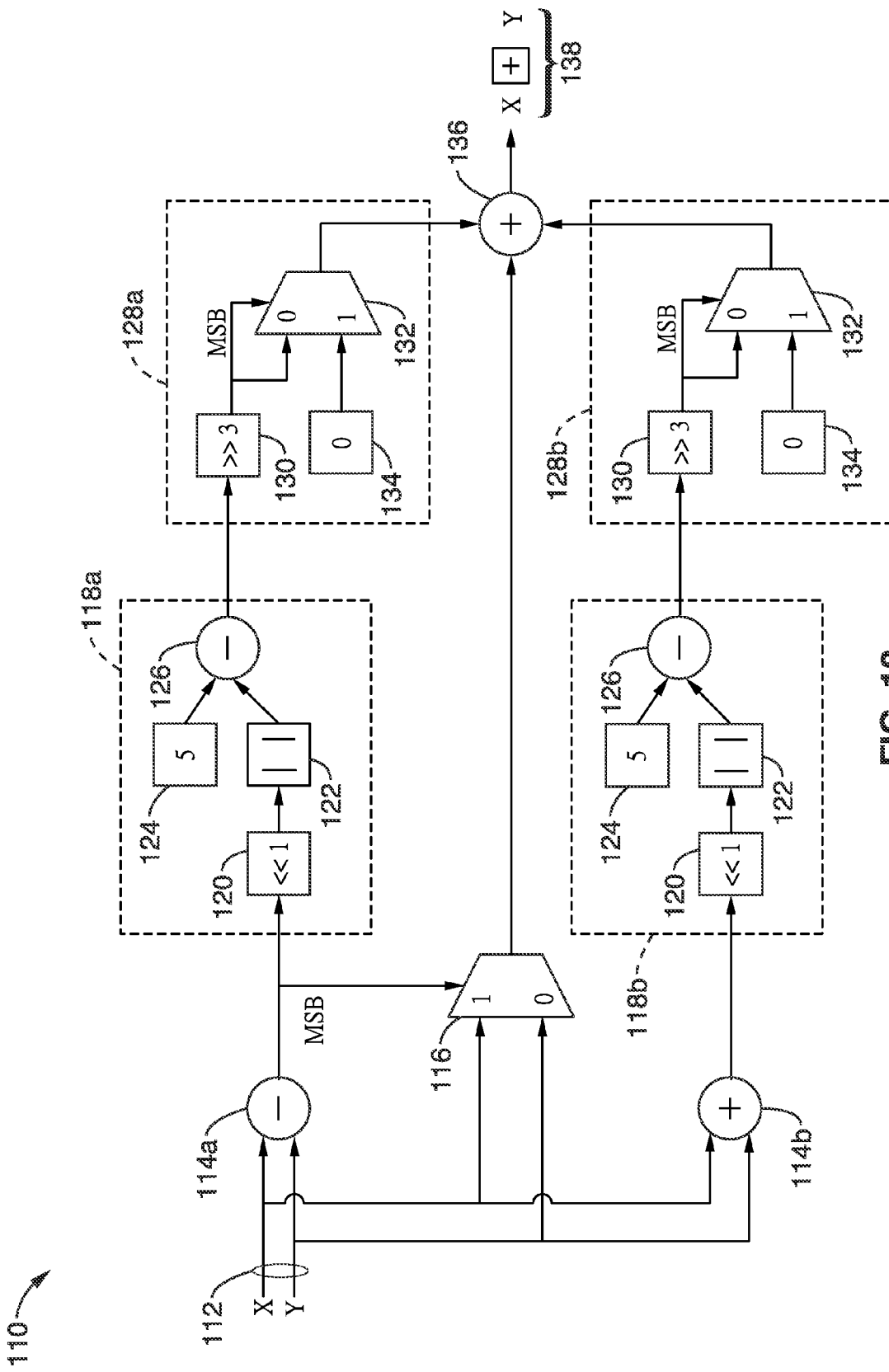
FIG. 13 is a schematic of Soft-XOR implementation according to an aspect of the present invention.

FIG. 13 illustrates an embodiment 110 of a Soft-XOR operator that can be implemented by the following hardware-friendly equation.

$$x \boxplus y \equiv \varphi(\varphi(x) + \varphi(y))$$
$$= \log(1 + e^{(x+y)}) - \log(e^{-x} + e^{-y})$$
$$\approx \min(x, y) + \max\left(\frac{5 - 2|x+y|}{8}, 0\right) - \max\left(\frac{5 - 2|x-y|}{8}, 0\right)$$

Referring to FIG. 13, at block 72, X and Y are the inputs of a Soft-XOR operator, which feed sum and difference blocks 114a, 114b. The difference block 114a (X minus Y) is used to determine min(x,y) and this part of the computation corresponds to the third term in the above equation. The sum in 114b (X plus Y) is used to compute the second term in the above equation. Block 116 is a 2-to-1 multiplexer (MUX) which uses the most significant bit (MSB) of the output from block 114a to decide the value of min(x,y).

Circuit 118a computes the value of 5−2|x+y| which is the numerator of the second term in the above equation. Circuit 118b computes the value of 5−2|x−y| which is the numerator of the third term in the above equation. In block 120 a left shift of 1 bit is performed for all the input bits which is equivalent to multiplying the input by 2. In block 122 the absolute value is calculated. For a positive number, the output of the absolute value remains the same as the input, while for a 1's complement negative number, the output is equal to the inversion of every input bit. For a 2's complement negative number, the output is equal to the inversion of every input bit and then adding 1. Block 124 represents a constant of 5. In block 126 a subtractor circuit (difference) is applied.

Circuit 128a computes the final value of the second term in the above equation, while circuit 128b computes the final value of the third term in the above equation. Block 130 performs a right shift of 3 bits of all the input bits, and is equivalent to dividing the input by 8. Block 132 is a 2-to-1 multiplexer (MUX) using the MSB of the output of block 130 output to select the value of $$\frac{5 \pm 2|x - y|}{8}$$

or 0. Block 134 is a constant of 0.

An addition is performed in block 136 to sum the three terms of the above equation, with the final value 138 of the Soft-XOR operator being generated.

3. Advantages and Improvements.

A technique, referred to herein as Z-LBP, has been taught describing a low-complexity sequential schedule of variable-node updates. For a degree—$d_c$ check-node, the computational complexity per iteration of Z-LBP is $d_c/2$ times simpler than that of V-LBP. Also, Z-LBP is 1.5 times simpler than flooding and C-LBP. Z-LBP outperforms flooding with a faster convergence speed and better decoding capability.

For QC-LDPC codes where the sub-matrices can have at most one "1" per column and one "1" per row, Z-LBP can perform partially-parallel decoding with the same performance as C-LBP. Therefore, in this case Z-LBP is an alternative implementation of LBP.

However, for small-to-medium blocklength high-rate QC-LDPC codes whose parity-check matrix contains only one row of sub-matrices, the partially-parallel C-LBP is exactly the same as flooding. In contrast, the proposed Z-LBP can still perform partially-parallel decoding and maintains a sequential schedule.

The present invention can be utilized for decoding LDPC codes defined by a very sparse parity-check matrix to provide various channel coding solutions for modern wireless communication systems, memory and data storage systems. By way of example and not limitation the present invention can be integrated within medium-rate LDPC codes used in standards, such as DVB-S2, WiMax (IEEE 802.16e), and wireless LAN (IEEE 802.11n), as well as high-rate LDPC codes for mmWave WPAN (IEEE 802.15.3c), and so forth.

The present invention provides methods and apparatus for decoding LDPC codes according to a lower complexity layered belief propagation network. The following summarizes, by way of example and not limitation, a number of implementations, modes and features described herein for the present invention.

1. An apparatus, comprising: a parity check matrix having multiple rows of interconnected exclusive-OR gates; and a control circuit configured for sequential scheduling of message passing to update check-nodes and variable-nodes when decoding codeword data blocks received by said apparatus; said control circuit adapted for performing variable-node updates in a zigzag pattern over said parity check matrix in which generation and propagation of messages is performed in opposite directions through said parity check matrix for even and odd iterations of sequential scheduling.

2. An apparatus as recited in embodiment 1, wherein said apparatus performs pipelined checksum decoding of low density parity check (LDPC) encoded data blocks through said parity check matrix in response to updating based on layered belief propagation (LBP).

3. An apparatus as recited in embodiment 1, wherein said control circuit is configured for updating sub-matrix columns within said parity check matrix for performing partially-parallel checksum decoding within said apparatus.

4. An apparatus as recited in embodiment 1, wherein said apparatus provides channel coding within a communications system, magnetic memory system, or solid-state drive system.

5. An apparatus as recited in embodiment 1, wherein completion of said iterations by said control circuit is determined in response to codeword convergence within said apparatus, or reaching a predetermined number of iterations.

6. An apparatus as recited in embodiment 1, wherein said interconnected exclusive-OR gates comprise a backward row, a forward row, and at least one other uni-directional row between said backward and forward rows.

7. An apparatus as recited in embodiment 1, wherein either forward message accumulation or backward message accumulation is performed within each iteration of sequential scheduling, without the need of performing both forward and backward message accumulation for each iteration.

8. An apparatus as recited in embodiment 1, wherein said interconnected exclusive-OR gates comprise soft exclusive-OR (soft XOR) circuits.

9. An apparatus as recited in embodiment 1, wherein said parity check matrix comprises a sparse parity check matrix having at most one "1" per column and one "1" per row.

10. An apparatus as recited in embodiment 1, wherein for any degree $d_c$ check-node the parity check matrix for the apparatus comprises $2(d_c-2)$ logic blocks, while for flooding and check-centered LBP (C-LBP) $3(d_c-2)$ exclusive-OR gates are required, and for variable-centered LBP (V-LBP) $d_c(d_c-2)$ exclusive-OR gates are required.

11. An apparatus embodiment as recited in embodiment 1, wherein said control circuit requires a memory size of $N_E$, which is equal to the number of the edges of an associated bi-partite graph.

12. An apparatus, comprising: a memory configured for retaining messages and accumulating forward and backward messages for check-nodes within an associated parity check matrix having multiple rows of interconnected exclusive-OR gates; and a control circuit configured for sequential scheduling of message passing to update check-nodes and variable-nodes on the associated parity check matrix when decoding codewords data blocks received by said apparatus; said control circuit adapted for performing variable-node updates in a zigzag pattern over said parity check matrix in which generation and propagation of messages is performed in opposite directions through the associated parity check matrix for even and odd iterations of sequential scheduling.

13. An apparatus as recited in embodiment 12, wherein said apparatus in combination with a parity check matrix performs pipelined checksum decoding of low density parity check (LDPC) encoded data blocks through the associated parity check matrix in response to updating based on layered belief propagation (LBP).

14. An apparatus as recited in embodiment 12, wherein said control circuit is configured for updating sub-matrix columns within the associated parity check matrix for performing partially-parallel checksum decoding within said apparatus.

15. An apparatus as recited in embodiment 12, wherein completion of said iterations is determined in response to codeword convergence within said apparatus, or reaching a predetermined number of iterations.

16. An apparatus as recited in embodiment 12, wherein either forward message accumulation or backward message accumulation is performed within each iteration of sequential scheduling, without the need of performing both forward and backward message accumulation for each iteration, or of simultaneously updating all nodes as in a flooding approach.

17. An apparatus as recited in embodiment 12, wherein said interconnected exclusive-OR gates comprise soft exclusive-OR (soft XOR) circuits.

18. A method of decoding low density parity check (LDPC) encoded data blocks through a parity check matrix in response to updating based on layered belief propagation (LBP), comprising: sequentially scheduling message passing to update check-nodes and variable-nodes within a parity check matrix through a series of iterations; generating and propagating messages in a first direction on odd iterations; and generating and propagating messages in a second direction on even iterations.

19. A method as recited in embodiment 18, further comprising initializing messages and forward message accumulation in response to the order of received channel information, prior to executing said series of iterations.

20. A method as recited in embodiment 18, further comprising updating of sub-matrix columns within an associated parity check matrix in response to performing partially-parallel checksum decoding within said apparatus.

Embodiments of the present invention may be described with reference to equations, algorithms, and/or flowchart illustrations of methods according to embodiments of the invention. These methods may be implemented using computer program instructions executable on a computer. These methods may also be implemented as computer program products either separately, or as a component of an apparatus or system. In this regard, each equation, algorithm, or block or step of a flowchart, and combinations thereof, may be implemented by various means, such as hardware, firmware, and/or software including one or more computer program instructions embodied in computer-readable program code logic. As will be appreciated, any such computer program instructions may be loaded onto a computer, including without limitation a general purpose computer or special purpose computer, or other programmable processing apparatus to produce a machine, such that the computer program instructions which execute on the computer or other programmable processing apparatus create means for implementing the functions specified in the equation (s), algorithm(s), and/or flowchart(s).

Accordingly, the equations, algorithms, and/or flowcharts support combinations of means for performing the specified functions, combinations of steps for performing the specified functions, and computer program instructions, such as embodied in computer-readable program code logic means, for performing the specified functions. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, these computer program instructions, such as embodied in computer-readable program code logic, may also be stored in a computer readable memory that can direct a computer or other programmable processing apparatus to function in a particular manner, such that the instructions stored in the computer-readable memory produce an article of manufacture including instruction means which implement the function specified in the block(s) of the flowchart(s). The computer program instructions may also be loaded onto a computer or other programmable processing apparatus to cause a series of operational steps to be performed on the computer or other programmable processing apparatus to produce a computer-implemented process such that the instructions which execute on the computer or other programmable processing apparatus provide steps for implementing the functions specified in the equation (s), algorithm(s), and/or block(s) of the flowchart(s).

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus, comprising:
multiple rows of binary operators, each of said binary operators having two message inputs, with said multiple rows of binary operators interconnected according to a parity check matrix; and
a control circuit configured for sequential scheduling of message passing and combining to update check-nodes and variable-nodes when decoding codeword data blocks received by said apparatus;
said control circuit adapted for performing said message passing and combining according to said sequential scheduling in a zigzag pattern over said multiple rows of binary operators in which said messages for variable-nodes are processed in a first direction for even iterations, and said variable-nodes are processed in a second direction for odd iterations.

2. The apparatus recited in claim 1, wherein said apparatus performs pipelined checksum decoding of low density parity check (LDPC) encoded data blocks through said multiple rows of binary operators in response to updating based on layered belief propagation (LBP).

3. The apparatus recited in claim 1, wherein said control circuit is configured for updating sub-matrix columns within said multiple rows of binary operators for performing partially-parallel checksum decoding within said apparatus.

4. The apparatus recited in claim 1, wherein said apparatus provides channel coding within a group of systems utilizing channel coding as selected from communications systems, magnetic storage systems and solid-state drive systems.

5. The apparatus recited in claim 1, wherein completion of said iterations by said control circuit is determined in response to codeword convergence within said apparatus, or reaching a predetermined number of iterations.

6. The apparatus recited in claim 1, wherein said binary operators comprise a backward row, a forward row, and at least one other uni-directional row between said backward and forward rows.

7. The apparatus recited in claim 1, wherein either forward message accumulation or backward message accumulation is performed within each iteration of sequential scheduling, without the need of performing both forward and backward message accumulation for each iteration.

8. The apparatus recited in claim 1, wherein said binary operators comprise soft exclusive-OR (soft XOR) circuits.

9. The apparatus recited in claim 1:
wherein said parity check matrix contains only one row of square sub-matrices;
wherein within said row of sub-matrices each sub-matrix contains a number of "1"s in each row and the same number of "1"s in each column of said sub-matrix; and
wherein said number is at most one for every sub-matrix as with certain quasi-cyclic LDPC codes or said number is more than one for at least one said sub-matrix as with certain small-to-medium block length high-rate quasi-cyclic LDPC codes.

10. The apparatus recited in claim 1, wherein for any degree $d_c$ check-node, $d_c-2$ of said binary operators perform operations to update the check node during a single iteration.

11. The apparatus recited in claim 1, wherein said control circuit requires a memory size of $N_E$, which is equal to the number of the edges of an associated bi-partite graph.

12. The apparatus recited in claim 1, wherein said first direction and said second direction comprise a forward direction and a backward direction, or alternatively a backward direction and a forward direction.

13. The apparatus recited in claim 12, wherein a forward term is computed during forward iterations and a backward term is computed during backward iterations.

14. The apparatus recited in claim 13, wherein said variable-node updates comprise computation of check-node to variable-node messages for that variable-node, each computed in response to combining a forward term and a backward term.

15. An apparatus, comprising:
a memory configured for retaining messages and accumulating forward and backward messages; and
a control circuit configured for executing sequential scheduling of message passing and combining to update check-nodes and variable-nodes for decoding codeword data blocks received by said apparatus, said decoding in accordance with a specified parity check matrix;
said control circuit adapted for performing said message passing and combining according to said sequential scheduling in which said variable-nodes are processed in a first direction for even iterations, and said variable-nodes are processed in a second direction for odd iterations.

16. The apparatus recited in claim 15, wherein said apparatus performs pipelined checksum decoding of low density parity check (LDPC) encoded data blocks through said message passage and combining in response to updating based on layered belief propagation (LBP).

17. The apparatus recited in claim 15, wherein said control circuit is configured for performing partially-parallel checksum decoding within said apparatus.

18. The apparatus recited in claim 15, wherein completion of said iterations is determined in response to codeword convergence within said apparatus, or reaching a predetermined number of iterations.

19. The apparatus recited in claim 15, wherein either forward message accumulation or backward message accumulation is performed within each iteration of sequential scheduling, without the need of performing both forward and backward message accumulation for each iteration.

20. The apparatus recited in claim 15, wherein said message combining is performed exclusive-OR (soft XOR) circuits.

21. The apparatus recited in claim 15, wherein said first direction and said second direction comprise a forward direction and a backward direction, or alternatively a backward direction and a forward direction.

22. The apparatus recited in claim 21, wherein a forward term is computed during forward iterations and a backward term is computed during backward iterations.

23. The apparatus recited in claim 22, wherein said variable-node updates comprise computation of check-node to variable-node messages for that variable-node, each computed in response to combining a forward term and a backward term.

24. A method of decoding low density parity check (LDPC) encoded data blocks through binary operators of a parity check matrix based on layered belief propagation (LBP), comprising:

sequentially scheduling message passing and combining, through a series of iterations, to update check-nodes and variable-nodes over rows of interconnected binary operators, with each said binary operator having two message inputs and a message output;

generating and propagating messages in a first direction on odd iterations; and generating and propagating messages in a second direction on even iterations.

25. The method recited claim 24, further comprising initializing messages and forward message accumulation in response to order of received channel information, prior to executing said series of iterations.

26. The method recited in claim 24, further comprising updating of sub-matrix columns within said multiple rows of binary operators in response to performing partially-parallel checksum decoding within said apparatus.

27. The method recited in claim 24, wherein said first direction and said second direction comprise a forward direction and a backward direction, or alternatively a backward direction and a forward direction.

28. The method recited in claim 27, wherein a forward term is computed during forward iterations and a backward term is computed during backward iterations.

29. The method recited in claim 28, wherein said variable-node updates comprise computation of check-node to variable-node messages for that variable-node, each computed in response to combining a forward term and a backward term.

30. The method recited in claim 24, wherein said binary operators comprise soft exclusive-OR (soft XOR) circuits, each of which has two message inputs.

\* \* \* \* \*